United States Patent [19]

Swiggett et al.

[11] Patent Number: 4,711,026
[45] Date of Patent: Dec. 8, 1987

[54] METHOD OF MAKING WIRES SCRIBED CIRCUIT BOARDS

[75] Inventors: Brian E. Swiggett, Huntington; Ronald Morino, Sea Cliff; Raymond J. Keogh, Huntington, all of N.Y.; Jonathan C. Crowell, Lakeville, Mass.; George Czenczy, Northport, N.Y.; Andrew J. Schoenberg, Huntington, N.Y.; Marju L. Friedrich, Babylon, N.Y.

[73] Assignee: Kollmorgen Technologies Corporation, Dallas, Tex.

[21] Appl. No.: 756,722

[22] Filed: Jul. 19, 1985

[51] Int. Cl.$^4$ .............................. H01K 3/10
[52] U.S. Cl. ...................... 29/850; 174/68.5
[58] Field of Search .................. 29/850, 836, 837; 174/68.5

[56] References Cited

U.S. PATENT DOCUMENTS

| 3,353,263 | 11/1967 | Helms | 29/850 X |
|---|---|---|---|
| 3,674,602 | 7/1972 | Keogh et al. | |
| 3,674,914 | 7/1972 | Burr | |
| 3,981,076 | 9/1976 | Nicolas | 29/836 |
| 4,031,612 | 6/1977 | Nicolas | 29/850 |
| 4,219,927 | 9/1980 | Fukutomi et al. | 29/850 |
| 4,327,124 | 4/1982 | Desmaris, Jr. | |
| 4,337,573 | 7/1982 | Nicolas et al. | |
| 4,414,741 | 11/1983 | Holt | |
| 4,450,623 | 5/1984 | Burr | |

FOREIGN PATENT DOCUMENTS

| 1102924 | 6/1981 | Canada. |
|---|---|---|
| 113820 | 6/1984 | European Pat. Off. |
| 21894 | 10/1984 | European Pat. Off. |
| 56-13013 | 10/1981 | Japan. |
| 57-136391 | 8/1982 | Japan. |
| 1504252 | 3/1978 | United Kingdom. |

OTHER PUBLICATIONS

Miller, Carl, "Soldering With Light", Photonics Spectra, May 1983, pp. 83-85.
Loefler, Jr. J. R., N/C "Laser Soldering Fast, Low cost, No Rejects, Assembly Engineering, Mar. 7, 1977, pp. 32-34.
Augat, Inc., "Augat Planar Stitch Wiring", 1983 Additive Technology Corp., The Wire Ink Company, 1983.
Floury, et al., "An Automatic Wiring Equipment for Hybrid Substrates", Proc. 32nd Electronic Comp. Conf., May 1982.
Webizky, et al., "Making 200,000 Circuits Fit Where At Most 6,000 Fit Before", Electronics, vol. 52, No. 15, Aug. 2, 1979.

Primary Examiner—Howard N. Goldberg
Assistant Examiner—Carl J. Arbes
Attorney, Agent, or Firm—Morgan & Finnegan

[57] ABSTRACT

This invention relates to interconnection circuit boards and processes for making and modifying interconnection circuit boards wherein adhesive is applied to a wire used in scribing a conductor pattern. The adhesive is activated to a tacky state during the wire scribing operation which forms the conductor pattern, and can thereafter be cured to permanently bond the conductors to the board surface.

34 Claims, 17 Drawing Figures

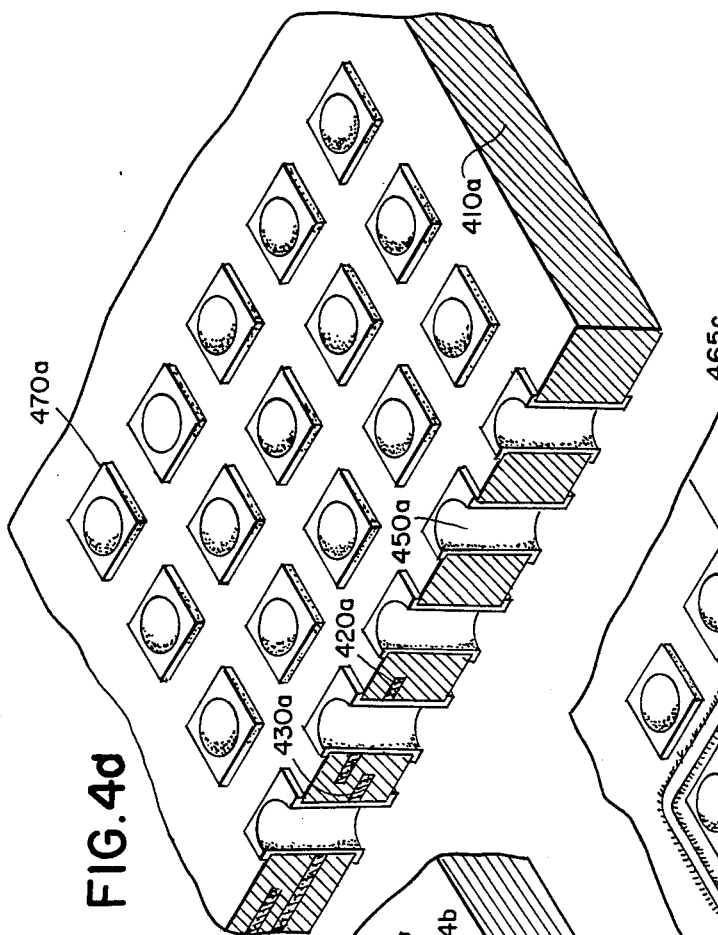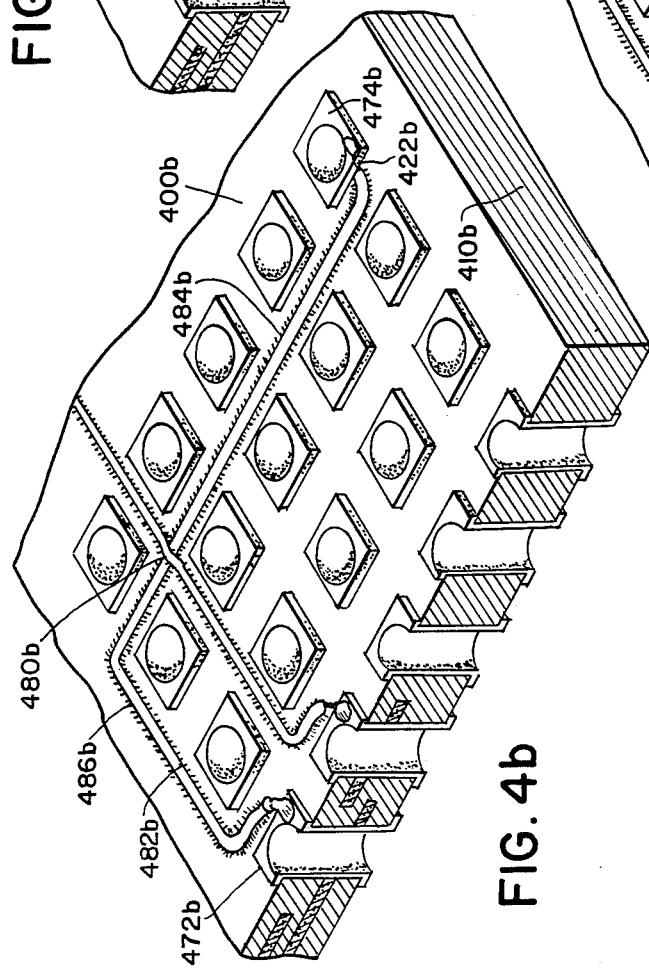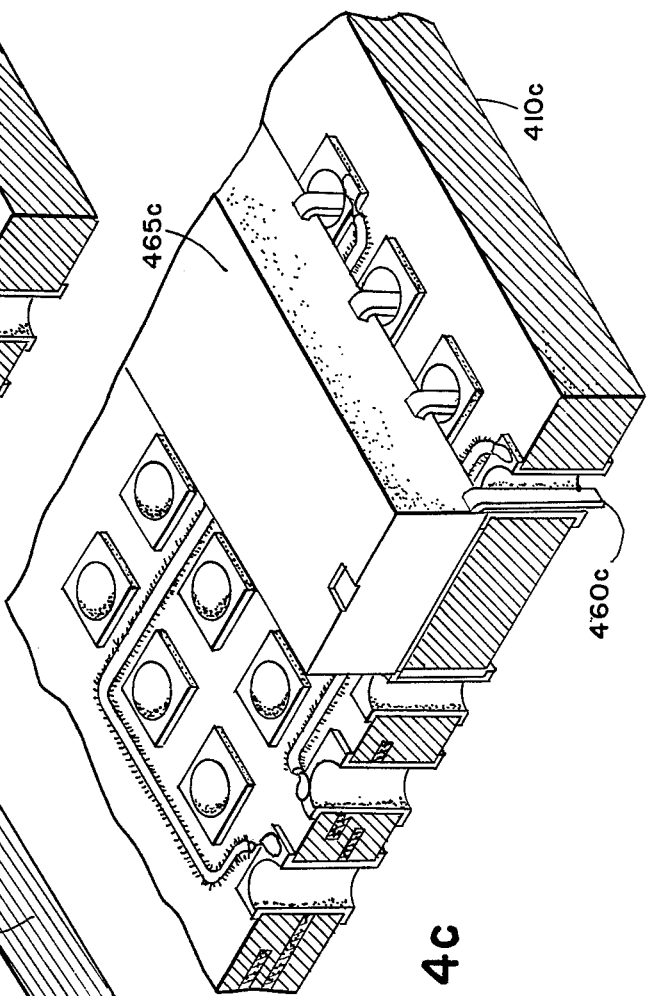

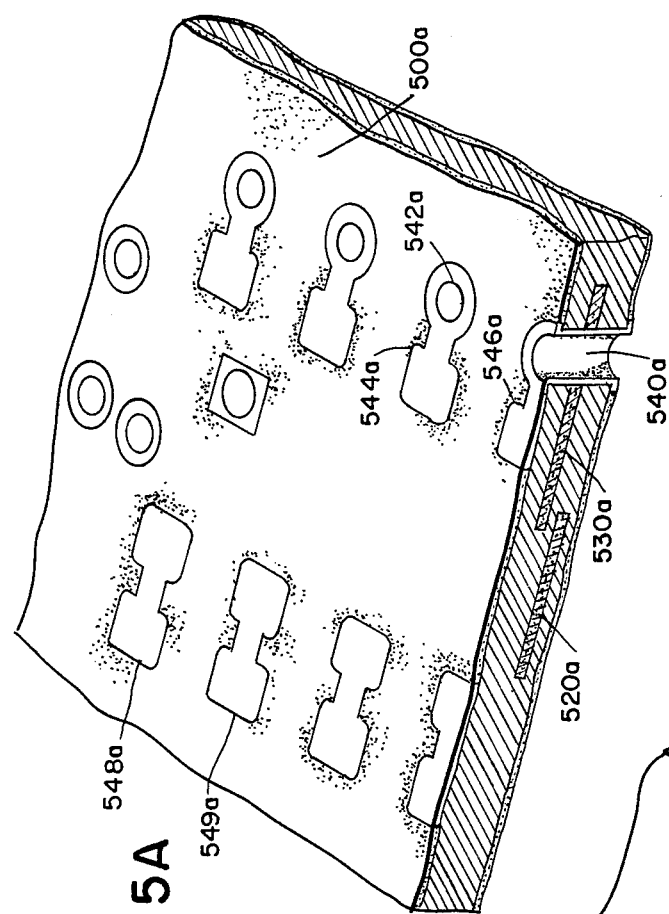
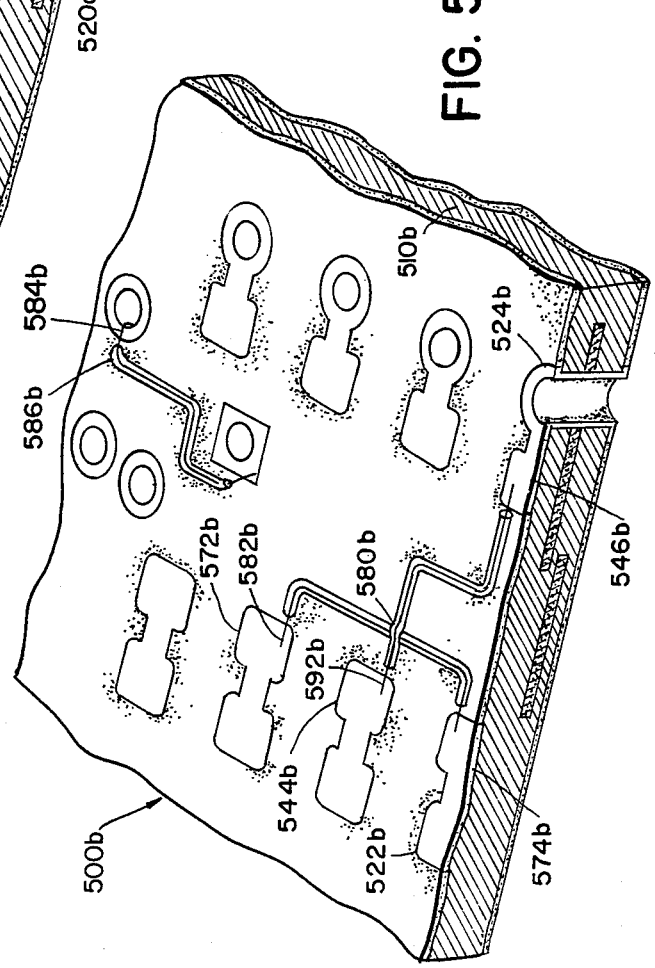

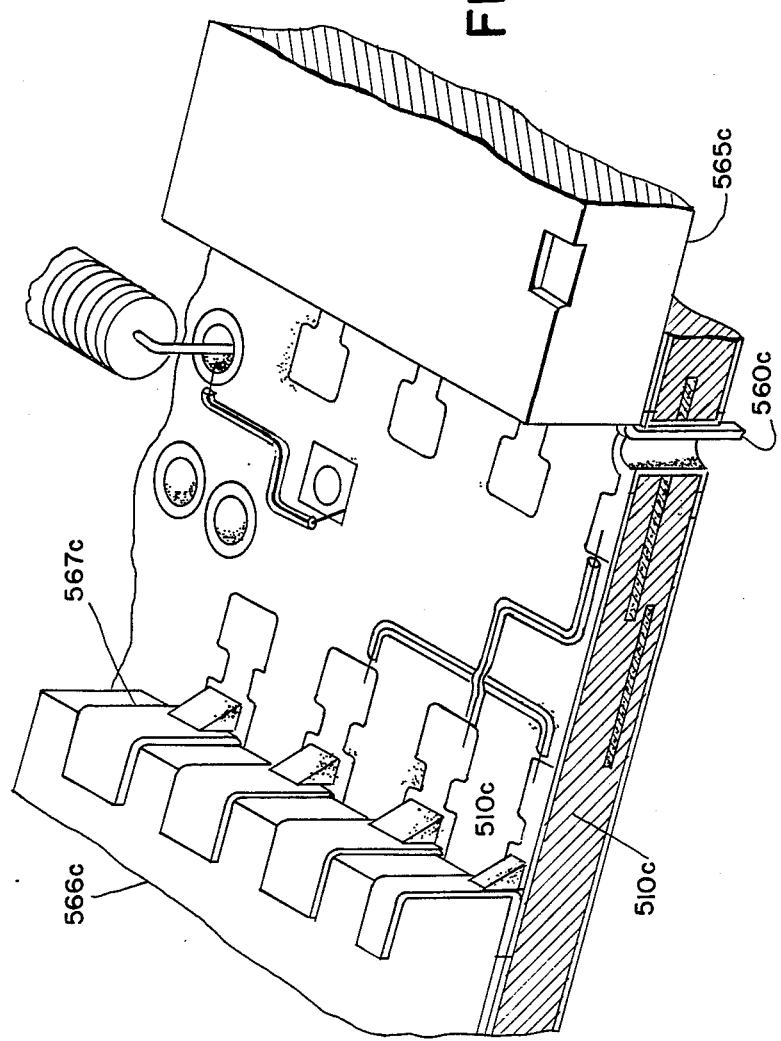
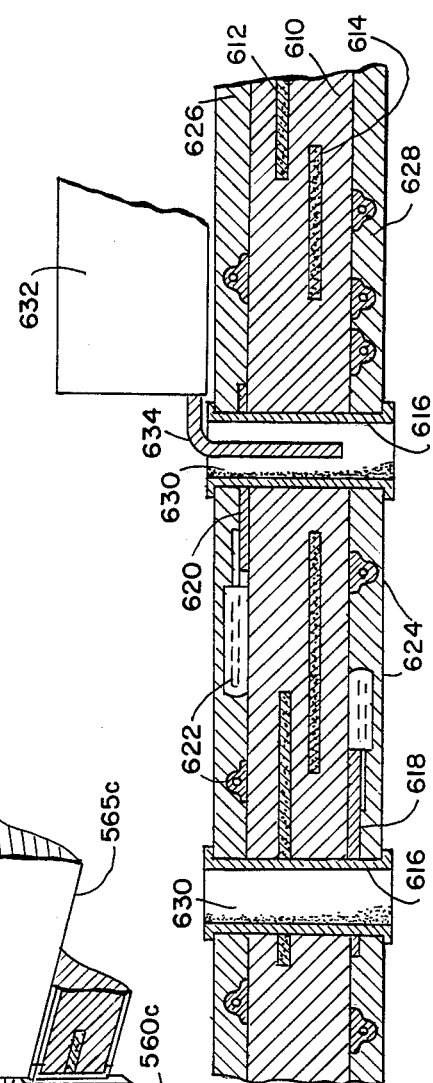
FIG. 5c
FIG. 6

METHOD OF MAKING WIRES SCRIBED CIRCUIT BOARDS

RELATED APPLICATIONS

The following applications filed concurrently herewith contain related subject matter and are incorporated herein by reference: (1) "Method of Manufacturing Interconnection Circuit Boards" by Ronald Morino, Brian Edward Swiggett, Raymond J. Keogh and Jonathan Clark Crowell; U.S. Ser. No. 06-756,691 (2) "Heat Activatable Adhesive for Wire Scribed Circuits" by Andrew Jed Schoenberg and Marju Laube Friedrich; U.S. Pat. No. 4,642,321, issued Feb. 10, 1987 (3) "Apparatus for Making Scribed Circuit Boards and Circuit Board Modifications" by Brian Edward Swiggett, Ronald Morino, Raymond J. Keogh and Jonathan Clark Crowell U.S. Ser. No. 06/756,690.

BACKGROUND OF THE INVENTION

This invention concerns scribed interconnections and processes for producing same. More particularly, this invention concerns discrete wire interconnections and processes for scribing conductors on a surface of a substrate to form or to modify point-to-point electrical connections.

Processes that employ wires as the interconnection medium in the production of circuit boards are known. In one such process, known as the Stitch Weld TM process, a standardized circuit board panel is utilized. The panel is comprised of pads and circuit holes representing various component sizes and pin densities of components. Components to be used in the circuit are matched to fit existing pads and holes on the standardized panel. Interconnection is achieved by welding endpoints of each wire to pads on the panel. This allows wires to be looped across the board between endpoints. Component insertion in this process is difficult. Wires typically cover the entire board thereby blocking areas where components are to be placed. Automatic component insertion, in most cases, cannot be used because component leads would get tangled in the wires.

U.S. Pat. No. 4,414,741 to Holt attempts to alleviate the "looping" problem of the Stitch Weld TM process. Holt describes placing temporary pins on a circuit board panel to define channels which do not interfere with component locations. Wires are routed within these channels and wire endpoints are soldered to the appropriate pads. The temporary pins are removed and the circuit board is covered by a plastic sheet which encapsulates the wires to retain them in the channels. However, this process has a number of disadvantages. First, wires still loop across the surface of the board from ends of the channels to wire termination points. Second, because certain portions of the circuit board are dedicated to the channels, the potential component density of the board is greatly diminished. Third, special holes must be drilled in the circuit board substrate to accommodate the temporary pins. Lastly, electrical interference and signal distortion may arise because a multiplicity of wires are positioned closely together in the channels.

Floury, et. al., "An automatic wiring eguipment for hybrid substrates", Proceedings of the 32nd Electronic Components Conference, May, 1982, describe another process for construction of circuit boards, wherein a fine line of adhesive is first dispensed along the desired wire paths. Wires are subseguently routed over the adhesive to bond wires to the circuit board. Endpoints of the wires are then bonded to pads. This process is inefficient, as it reguires the additional step of routing all wire paths with adhesive before placement of the wires on a board. The step of placing adhesive on the board prior to wire placement doubles the manufacturing time of the process. In addition, when wires cross over one another, there is no adhesion between the wires.

U.S. Pat. Nos. 3,674,914, to Burr; 3,674,602, to Keogh and Canadian Pat. No. 1,102,924 granted June 9, 1981, all incorporated herein by reference, describe a process and apparatus wherein wire is scribed onto an insulating base. A strand of preformed wire is fed continuously onto a surface of the base. The wire is simultaneously affixed to the base surface and cut at a predetermined terminal point on the base thereby producing a predetermined interconnection pattern. In practice, and as described in the patent, the wires are adhered to the surface of the base by applying adhesive to the base surface and activating the adhesive when the wires are scribed to the surface of the base. A difficulty of this arrangement, however, is that when activated on the board, the soft adhesive may allow the wire to drift or swim before the wire becomes adhesively set. This may lead to short or open circuits when the wires are not in their desired positions on the board. These patents also suggest the possibility of applying adhesive to the wires prior to the scribing of the wire conductors. However, there is no teaching of how to practice this suggestion.

European patent application No. 113,820 published July 25, 1984, describes a process wherein wire is scribed on a photocurable layer on the surface of a circuit board. The photocurable coating which receives the wire is softened prior to or at the time of scribing and is subsequently photocured. In the preferred form, ultrasonic energy is used to soften the adhesive layer and light energy is used to cure the photocurable adhesive layer.

U.S. Pat. No. 4,450,623 to Burr describes a process wherein wires are scribed on an adhesive-coated surface of a substrate having etched conductive pads representing terminal and inflection points in the circuit. Where the wire contacts a pad, it is soldered or welded thereto. Heat and pressure is then applied to the board to activate the adhesive and to embed the wire conductors into the substrate surface. Burr mentions the possible use of wire coated with adhesive. As before, once the wire has been scribed and soldered, heat and pressure is applied.

Japanese Laid Open application No. 57-136,391, published Aug. 23, 1982, describes a process wherein wires are scribed in a predetermined pattern onto an adhesive-coated surface of a substrate. Laser energy is used to soften the adhesive prior to scribing the wires.

British Patent Specification No. 1,504,252, published Mar. 15, 1978 describes a method of bonding and soldering insulated wires in a predetermined pattern on an insulating base support to establish electric contacts between conductive zones on the base support. Adhesive used for bonding the wires is deposited on the surface of the base support as a film layer in which heated wires may be embedded. Alternatively, a dry film coated wire is suggested which can be made self adhesive by heating or passing through a suitable solvent.

Wired circuit patterns have been made using a heated roller to embed enamel coated wire into an adhesiveclad substrate. The endpoints of the wire are soldered to exposed solder-coated pads on the substrate's surface. The adhesive is carefully applied to the sustrate by silk screen prior to the embedding step so as not to contaminate the solder pads and holes.

In another process, pre-perforated adhesive sheets are placed on the surface of a substrate having surface pads and holes. The perforations expose predetermined areas in which holes and surface feature will be placed. Conductors are then placed on the adhesive surface. However, each different board reguires its own special perforation pattern, making it cumbersome to use.

Processes that employ wires as the interconnection medium in the modification of printed circuit, multilayer and wire-scribed circuit boards are also known. These modifications may be reguired for different reasons. A circuit interconnection sequence may have to be changed by the designer to accommodate newly designed functionality on the circuit board. A conductor may be omitted or a misconnection may be made during the design process. A circuit board modification also may be required to correct a defect on the board that occurred during manufacture.

Repairing or modifying circuit boards is more economical and efficient than redesigning or manufacturing replacement circuit boards. The boards are typically modified by cutting unneeded connections and using small insulated wires commonly called "jumper wires". This wire addition process requires manual soldering of the wire endpoints. In this process, wires are usually looped away from the board. As greater numbers of jumper wires are added to the board, the circuit board becomes an unwieldy mass of looped jumper wires, commonly called a "rat's nest". The "rat's nest" often impedes or prevents the use of automatic component insertion, automatic soldering equipment and automatic circuit board test equipment, thus requiring additional manual operations which are time-consuming, error prone, and costly.

This manual jumper wire approach is economical only in low volume, low circuit density applications, where only a few additions are necessary. When high volume circuit board producers are forced to use this process, it is extremely costly because it is labor-intensive. Additionally, this process does not result in repeatable precise geometrical wire placement on all boards in a manufacturing lot. Also, defined impedance is difficult to achieve with jumper wires and reproducible electrical characteristics may be difficult to maintain.

Developments in semiconductor technology have increased the functionality of semi-conductors, i.e., the number of operations performed by the semiconductor, while decreasing the size of the overall semiconductor package. This results in a greater number of contact points in a smaller area for interconnection. Because of the greater number of contact points, the circuit board must provide for a higher density of interconnect per unit area.

This increases the probability of committing errors during a manual modification process. The close proximity of contact points or circuit terminal points on high density boards increases the probability of unintentionally modifying an erroneous endpoint.

Webizky et. al., "Making 100,000 Circuits Fit Where At Most 6,000 Fit Before", [*Electronics* Vol. 52, No. 15, (8-2-79)] describe a process wherein one surface of a circuit board is dedicated to pattern modifications. Although this process may improve the circuit board repair time, an additional circuit layer must be added to the board to accommodate the changes. This increases the manufacturing time and cost as well as the size of the circuit board package.

Processes for automatically repairing/modifying have been proposed. These include automatic positioning devices, optical light spot indicators, and laser soldering eguipment. These processes have helped to increase productivity, but they are still heavily dependent on manual placement of conductors or jumper wires. All the automated processes require a smooth, flat surface for modification.

U.S. Pat. No. 4,327,124 to DesMarais describes a process for screen printing circuit modifications on an etched printed circuit board wherein a dry photoprintable film resist is laminated on the circuit board over the existing conductors, exposed, developed, and cured. To apply the modifying conductors, a metal loaded, conductive polymer ink is applied through a screen to the film resist layer in the pattern of the conductor modifications. The circuit pattern is then covered with a conductive metal powder while the conductive polymer ink is still wet. The powder is pressed into the ink and the composition is cured. After the curing step, solder is screen-printed over the copper ink. The solder and copper are then fused together in an infrared reflow soldering machine. This process has many disadvantages and has not been widely adopted.

OBJECTS OF THE INVENTION

It is, therefore, an object of this invention to provide a process for efficiently and accurately manufacturing interconnection circuit boards and the circuit boards produced thereby.

Another object of the invention is to provide a process for constructing wire scribed circuit boards which does not require surface preparation, including application of an adhesive layer, prior to placement of conductors.

Still another object of this invention is to provide a process for interconnection in which the conductors can adhere to various types of surfaces and surface topographies.

Another object is to provide a process and apparatus for repairing or modifying circuit boards such that the repaired or modified circuit boards can be subsequently operated on by automatic component insertion, automatic soldering and automatic testing equipment.

An object of this invention to provide an automated process and apparatus to repair or modify circuit boards that can be employed at any stage of manufacture.

An object of this invention is to provide a process and apparatus for repairing interconnection circuit boards after components have been placed on the circuit board.

An object of this invention is to provide an automated process and apparatus for repairing or modifying interconnection circuit boards with repeatable precise geometric placement of conductors on boards.

Other objects and advantages of the process and apparatus will become apparent throughout the discussion hereinbelow.

DEFINITIONS

The following terms used throughout this specification have the meanings defined below:

A "conductor" is at least one preformed, elongated filament having at least one portion, a "conductive portion", capable of conducting energy, such as electrical energy or light energy. Conductors may be coated with an insulation layer.

A "substrate" is a base having a surface on which a circuit pattern may be produced. A substrate may already have a circuit pattern on its surface.

"Wire or conductor scribing" is a process by which conductors are applied and affixed to a substrate in a predetermined pattern to form a circuit pattern.

"Tacky" is the property of an adhesive which enables it to form a bond of measurable strength immediately after it is brought into contact with a substrate.

"Blocking" is undesired adhesion between touching layers of a material such as occurs under moderate pressure during storage or use.

An "interconnection" is a process or system permitting the joining of discrete conductor connections.

"C-stage" is the final stage in the reaction of certain thermosetting resins in which the material is relatively insoluble and infusible.

A "thermoset" material is a material that will undergo or has undergone a chemical reaction by the action of heat, ultrasonic energy, ultraviolet light, etc. leading to a relatively infusible state.

A "conductor endpoint" is the point of a conductor which can be attached to a terminal point.

A "heat activatable" adhesive is a dry adhesive film that is rendered tacky or fluid by application of heat or heat and pressure.

A "light activatable" adhesive is a dry adhesive film that is rendered tacky or fluid by application of light energy.

A "hot melt adhesive" is an adhesive which is applied in a molten state and forms a bond upon cooling to a solid state.

A "terminal point" is at least one point at which an interconnection is made with a conductor. Terminal points can be surface pads, holes or apertures with or without metallized walls, conductive cavities, conductive leads, conductive fingers or the like.

SUMMARY OF THE INVENTION

With interconnection circuit boards according to the invention, the adhesive is applied to the wire used in scribing the conductor pattern rather than to the board surface as has been the prior practice. The adhesive is activated to a tacky state during the wire scribing operation which forms the conductor pattern, and can thereafter be cured to permanently bond the conductors to the board surface. The technigue of this invention can be used in the initial manufacture of circuit boards or in the modification of pre-existing boards.

In the process for scribing a conductor to the surface of a substrate in a predetermined pattern, the conductor is precoated with an adhesive. Prior to the scribing step, the adhesive coating is solid, non tacky, non-blocking and preferably flexible. In the scribing step the adhesive is activated to a tacky state using thermal, radiant, or ultrasonic energy, or a combination thereof. The adhesive coating is capable of rapidly reverting to a solid, non-tacky condition after activation to form a bond. The adhesive coating on at least a portion of the conductor is activated prior to, or simultaneously with, scribing the conductor. According to the process of this invention, the activated portion of the adhesive coating is placed in contact with and wets the substrate surface, reverts to a non-tacky condition and forms a bond between the conductor, which it coats, and the surface.

The adhesive coating may be cured to a C-stage or a thermoset condition subsequent to the scribing step.

The adhesive coating employed for the conductors is a heat activatable composition which is preferably a three component formulation including:

(a) a film forming polymeric resin, (b) a filler and/or at least one or polyfunctional compound having a polyaromatic backbone, and (c) a curing agent non-reactive under conditions providing heat activation of the adhesive but being capable of reacting with the other components of the adhesive to cure the adhesive resin to the C-stage.

The adhesive must be non-blocking, non-tacky and preferably flexible when coated on the wire, must be activatable during wire scribing to form a bond sufficient to hold the conductor pattern in place, and is preferably curable to a C-stage to provide a permanent thermoset bond in the final product.

The preferred technique for activating the adhesive uses pulsed laser energy wherein the pulse repetition rate varies as a function of the rate at which wire is being scribed. The pulse energy is adjusted to provide the correct quantum of energy to activate the adhesive. Successive pulses activate adjacent or partially overlapping sections along the conductor length with the number of pulses per uniform length being constant. As a result, the pulse repetition rate varies as a function of speed and the energy applied along the length of the conductor is of the correct uniform value regardless of speed.

The interconnection circuit board according to the invention includes at least one insulated conductor which is adhered to the surface of the substrate by means of a non-tacky, non-blocking adhesive coating at least partially encapsulating the conductor. In a cross-sectional view, the outline of the adhesive coating usually forms a characteristic bell-shaped configuration over the conductor. The adhesive coating is bonded to the substrate at the points of contact between the surface and the conductor. In the vicinity of conductor crossovers, the adhesive forms a bond between conductors.

The process of this invention can be used to produce new interconnection circuit boards using standardized or nonstandardized formats. It can also be used to modify existing interconnection circuit boards such as printer wiring boards or discrete wire boards at any stage of their construction. Modifications can be made on circuit boards either prior to or after inserting or placing components. Modifications may also be made to circuit boards having oversized surface pads, dual surface pads or double-socketed circuit holes.

BRIEF DESCRIPTION OF THE DRAWINGS

FIG. 1a is a perspective view with partial cut-aways showing a completed interconnection circuit board having terminal holes prior to insertion of components.

FIG. 1b is a perspective view with partial cut-aways showing of the circuit board of FIG. 1a wherein modification conductors have been scribed to the surface of the board according to the process of this invention.

FIG. 1c is a perspective view with partial cut-aways of the modified circuit board of FIG. 1b with three components inserted.

FIG. 1d is a perspective view with partial cut-aways of the modified circuit board of FIG. 1c after solder is placed in the terminal holes.

FIG. 2a is a perspective view with partial cut-aways showing an interconnection circuit board having six terminal pads prior to addition of components.

FIG. 2b is a perspective view with partial cut-aways showing the board of FIG. 2a with two insulated conductors scribed to the surface of the board according to the process of this invention.

FIG. 2c is a perspective view with partial cut-aways of the board of FIG. 2b subsequent to addition of a surface-attached component.

FIGS. 4a through 4c show, sequentially, perspective views of fabricating an interconnection circuit board according to the process of this invention.

FIG. 4a is a perspective view with partial cut-aways of a prefabricated circuit board format having twenty predrilled standardized metallized terminal hole locations.

FIG. 4b is a perspective view with partial cut-aways of prefabricated circuit board format of FIG. 4a with two conductors scribed between terminal holes and soldered to said holes to makes the interconnections.

FIG. 4c is a perspective view with partial cut-aways showing the circuit board format of FIG. 4b having a leaded component inserted into the terminal holes.

FIGS. 5a through 5c show, sequentially, perspective views of the fabrication of a non-standardized interconnection circuit board having eight terminal holes and eight terminal pads.

FIG. 5a is a perspective view with partial cut-aways of a circuit board panel having terminal holes and pads which is to be scribed with conductors according to the method of this invention.

FIG. 5b is a perspective view with partial cut-aways of the panel of FIG. 5a after three adhesive-coated conductors have been scribed between terminal points.

FIG. 5c is a perspective view with partial cut-aways of the panel of FIG. 5b after components have been inserted and attached to the panel.

FIG. 6 is a cross-sectional view of a circuit board including adhesive coated conductors ahdered to both sides of the circuit board.

DETAILED DESCRIPTION OF THE PREFERRED EMBODIMENTS

Figure 1B:
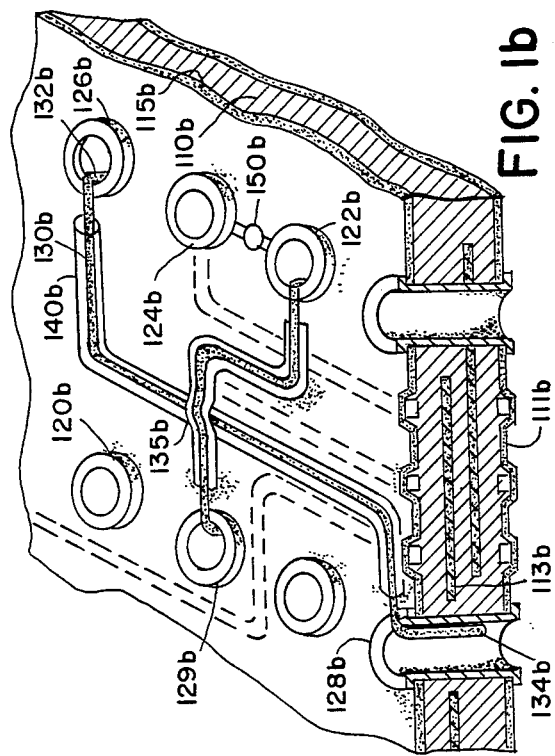
FIGS. 1a through 1d show, sequentially, perspective views of circuit board modification.

In accordance with the present invention, an adhesive coated conductor is scribed in a predetermined pattern on a surface of a substrate. The adhesive is activated as the conductor is being scribed to form a bond holding the conductors in place. The circuit board is preferably thereafter cured to provide a permanent thermoset bond for the conductor pattern.

Conductor Preparation - Adhesive Coatings

The conductors used in this process are coated with a substance hereinafter referred to as the "adhesive coating" which is used to bond the conductor to a surface. Prior to activation, the adhesive coating is non-tacky, non-blocking and preferably flexible. These properties permit handling and manipulation of the adhesive coated conductor prior to and during scribing. The coated conductor may be stored on a spool for easy storage and access. Furthermore, the adhesive coating, does not adhere to or leave residue which will clog the apparatus used to scribe the conductors. The adhesive coating, in its activated state, provides adhesion between the conductor and the surface of the substrate on which the conductor is to be scribed. It should provide sufficient strength to allow the formation and subsequent preservation of conductor inflections on the surface.

The adhesive coatings used in the practice of this invention are able to adhere to a wide variety of materials which are used on or comprise the surfaces of substrates useful in the interconnection circuit board industry. These materials include insulating and conductive surfaces, e.g. polymer resins, ceramics, glass bonded metal or carbon conductors, polymer-bonded metal or carbon powder conductors, or conductive polymers. Examples of such materials include: dielectrics, e.g. phenolics, polyimides, epoxy-glass laminates, thermoplastics, thermosets, solder masks, such as thermally cured thermosets, ultraviolet radiation-cured materials, materials cured by multiple mechanisms, legend or nomenclature inks, and ceramics; and metallic surfaces, such as copper, plated or reflowed solder, gold, silver, nickel, conductive inks, and thick and thin film screened conductors. Preferably, the adhesive coating is able to adhere to to these surfaces. However, an adhesive coating which adheres to a limited number of surface materials may also be used.

The substrate can be a blank circuit substrate or a circuit substrate having etched foil power and ground conductors or the like, an electronic interconnection board, including a discrete-wired circuit board, a standard printed circuit board, a multilayer circuit board, a circuit board with components thereon or a circuit board at any other stage of construction.

The adhesive coating should be flexible to allow the conductor to travel smoothly through a scribing apparatus and to allow the conductor to form a variety of inflection angles.

Upon activation, the adhesive coating becomes tacky and can bond the conductor to the substrate surface. Once the adhesive coating is activated and the conductor applied and bonded to the surface, the adhesive coating rapidly reverts to a solid, non-tacky condition. The rapid reversion to a solid, non-tacky condition does not entail any substantial change in the adhesive coating's conformation or volume. This reversion occurs in about 50 to 200 milliseconds which is sufficiently short to allow the conductor pattern to retain dimensional stability, thus limiting or substantially avoiding relative movement of the bonded conductors with respect to each other and the substrate surface.

The adhesive coating and, if present, one or more underlying layer(s) of insulation should be removable at the endpoints of the conductor. When the insulation is removed, electrical connections can be made between the scribed conductor and the terminal points. The adhesive coating and insulation layer(s) should be able to be removed without damage to the conductor or the surface to which the conductor is bonded. This removal process is hereinafter referred to as "stripping".

The bond formed by the adhesive coating employed in the practice of this invention can withstand any subsequent processing that is typically performed during the fabrication of a circuit board. It is resistant to chemicals used during manufacture, such as cleaning solutions, solder flux and the like. The bond also can withstand a variety of different thermal environments to which the board may be subjected. The adhesive coating is resistant to breakage or deformation caused by mechanical stress, such as handling and manual or machine tooling.

A suitable non-tacky, non-blocking, flexible adhesive coating composition comprises:

(a) a first component comprised of a film forming polymeric resin (1) having an average molecular weight ($M_w$) between about 10,000 and about 100,000 and (2) having an epoxide, hydroxyl or unsaturated functionality greater than 2, said polymeric resin being selected from the group consisting of polyesters, polyurethanes, polyethers, epoxies, allyl polymers and acrylics;

(b) a second component selected from the group consisting of a filler, polyfunctional compounds and mixtures thereof, said polyfunctional compounds having an average molecular weight below about 7,000 and containing a polyphenol backbone, the weight ratio of said first component to said second component being between about 1.5:1 and about 9:1; and (c) a curing agent which is capable of reacting or initiating a reaction with the functional groups of the polymeric resin to form crosslinks and cure the polymeric resin to a C-stage upon application of sufficient energy in the form of heat or radiant energy, said curing agent being non-reactive or blocked at the temperatures required to activate the adhesive composition, said curing agent being present in an amount sufficient to C-stage the polymeric resin; said composition being flexible, and in the C-stage capable of forming an infusible composition which does not melt, flow or decompose when exposed for 10 seconds to molten solder at 260° C. and does not soften when exposed to dichloromethane at 25° C. for 10 seconds.

The adhesive may also be a solid adhesive composition which is thermosetting and can be activated upon application of sufficient heat or ultrasonic energy without thermosetting, such a composition comprising:

(a) a first component comprised of a film forming polymeric resin having a hydroxyl functionality greater than 2 and selected from the group of polyols consisting of polyesters, polyurethanes, polyethers, epoxies, and combinations thereof, said resin having been reacted to the B-stage with a first curing agent which was present either in less than a stoichiometric quantity or was capable of reacting with functional groups that were present at low concentrations on the polymer chain, said curing agent being a polyisocyanate and having been present in an amount sufficient to react with 10 to 60 percent of the hydroxyl groups to B-stage the polymeric resin sufficiently to provide the composition with non-blocking properties; and (b) a second component selected from the group consisting of a filler, polyfunctional compounds and mixtures thereof, said polyfunctional compounds having an average molecular weight below about 7,000 and containing a polyaromatic backbone, the weight ratio of said first component to said second component being between about 1.5:1 and about 9:1 and (c) a C-stage curing agent which is capable of initiating a reaction with the hydroxyl groups of the polymeric resin to form crosslinks and cure the polymeric resin to a C-stage upon application of sufficient energy in the form of heat or light, said second curing agent being non-reactive or blocked at the temperatures required to activate the adhesive composition; said composition being flexible, and in the C-stage capable of forming an infusible composition which does not melt, flow or decompose when exposed for 10 seconds to molten solder at 288° C. and does not soften when exposed to dichloromethane at 25° C. for 10 seconds.

Another adhesive coating composition which can be used comprises:

(a) a film forming epoxy resin having been reacted to a B-stage polymer having an average molecular weight, greater than about 30,000;

(b) a polyfunctional resin having an average molecular weight below about 5,000 and containing a polyphenol backbone, the weight ratio of said first component to said second component being between about 1:1 and about 3:1; and (c) a curing agent which is capable of reacting or initiating a reaction with the functional groups of at least one of the resins to form crosslinks and cure the resin to a C-stage upon application of sufficient energy in the form of heat or radiant energy, said curing agent being non-reactive or blocked at the temperatures required to activate the adhesive composition, said curing agent being present in an amount sufficient to C-stage the resin; said composition being flexible, and in the C-stage capable of forming an infusible composition which does not melt, flow or decompose when exposed for 10 seconds to molten solder at 260° C. and does not soften when exposed to dichloromethane at 25° C. for 10 seconds.

The adhesive coatings may be thermoplastic or thermosetting. The coating may be composed of a homopolymer, a copolymer or a blend of polymers. Additives may be included that impart the capability of partially curing the adhesive coating in advance of conductor placement and final curing of the adhesive coating after scribing.

Homopolymers and copolymers used in the process of this invention may have thermoplastic properties. For example, high molecular weight polyesters (molecular weight of between about 5,000–25,000, preferably between about 15,000–20,000), high molecular weight polyurethanes (molecular weight of about 3,000–15,000, preferably about 7,000–12,000), and polyolefins, and the like may be used as thermoplastic adhesive coatings in this invention.

Thermosetting polymers may be used in a partially-cured or B-staged state in the adhesive coatings in the process of this invention. For example, high molecular weight epoxy and phenoxy resins may be used. Urethane acrylates, polyesters, and acrylated epoxies having a molecular weight of between about 600 and 1100 and other epoxies having an epoxide eguivalent weight of between about 1,000 and 2,000 and the like may be used. Novolac or resole phenolic resins having a molecular weight of between about 800 and 1500 are also useful in the process of this invention. Novolac epoxies are particularly useful in applications involving high-temperature exposure. When epoxy resins are used, it may be necessary to reduce their surface tension with flow modifiers, surfactants and fillers. Epoxy curing agents such as polyamide may be used to partially cure the epoxy and render the coating non-tacky. Polyimides may also be used in the adhesive coating in the process of this invention.

Partially-cured, or B-staged, polymers which can be cross-linked by a blocked curing agent, e.g. blocked isocyanate, can also be used. These polymers can be B-staged at a temperature higher than that used to coat the conductor.

Copolymer and polymer blends can be used in the process of this invention to make adhesive coating material. Further, partial curing may be accomplished with a single curing agent if the polymers are carefully chosen to contain the same type of reactive group. Examples of copolymers useful in the process of this invention are high molecular weight hydroxy-containing polyester copolymerized with a high molecular weight hydroxy-containing epoxy by reaction with an isocyanate. Another polymer blend useful in the process of this invention is a blend of a high molecular weight (about 20,000) hydroxy containing polyester and a low molecular weight (about 2,500) hydroxy containing polyester copolymerized with an isocyanate.

Free radical polymerization post-curing of the adhesive coating can be achieved using appropriate curing agents. For example, free radical polymerization using ultraviolet light can be accomplished by incorporating into the adhesive coating composition 2,2-dimethoxy-2-phenylacetophenone, 1-hydroxycyclohexyl phenylketone or the like. Thermal free radical polymerization can be accomplished by incorporating 1,1'-azobis (cyclohexane carbonitrile), dicumyl peroxide, 1,1'-bis(tert butylperoxy)-di-isopropylbenzene or the like into the adhesive coating composition. Electron beam curing agents can also be used for free radical polymerization.

Fillers may be added to an adhesive coating composition in order to improve its non-blocking properties prior to use. Fumed silica (commercially available as Cab-O-Sil TM from Cabot Corporation), talc, titanium dioxide and the like may be used for this purpose.

Other compositions used in the adhesive coating of this invention are set forth in copending patent application entitled "Heat Activatable Adhesive For Wire Scribed Circuits" (Schoenberg et al.) which is incorporated herein by reference.

The adhesive coating may be made up of two or more layers. One layer may be an adhesive and the other layers may serve other functions. For example, an adhesive layer may be applied to the conductor and a protective outer layer may be applied over it which can be dissipated by exposure to an energy source. The outer dry coating allows handling and spooling. The inner coating may be tacky with surface wetting characteristics. An energy source such as a laser may be used to melt the outer coating and expose the tacky material to the substrate surface for bonding. In another embodiment, the coating may contain microencapsulated regions of low viscosity, such as cyanoacrylate, that can be released on exposure to pressure. When the encapsulated regions open, the adhesive properties of the coating are activated. After scribing, the adhesive coating is cured to render it non-tacky.

A number of techniques are known which are suitable for applying the adhesive coating to conductors. For example, the conductor may be dragged through a felt material soaked with a very low viscosity adhesive coating composition. Uniform concentric layers of coating may be formed by orienting the conductor in random directions and passing it along the felt several times.

The die extrusion technique for applying the adhesive coating consists of passing the conductor through a drawing die. On one side of the die is a reservoir of viscous adhesive material. The conductor is drawn through the reservoir and then through the die. Adhesive material coats the conductor as the conductor is drawn through the die. The hydrostatic action of the adhesive material acts to center the conductor in the die such that an even coating is formed around the circumference of the conductor. Once the coated conductor leaves the die, the coating is exposed to heat in order to drive off solvents.

Adhesive Activation And Curing

The adhesive-coated conductor can be scribed to the surface of a substrate. During the scribing process of this invention, the conductor preferably is automatically placed on and bonded to the substrate surface along a predetermined path. The substrate surface preferably is mounted on a movable work table. The conductor is fed to the substrate surface from a scribing head assembly. The conductor is laid on the substrate surface by moving the work table relative to the scribing head assembly and by rotating a scribing head assembly in the direction of table movement. The wire scribing head assembly and the table movement are preferably numerically controlled.

As the conductor is fed toward the surface, and just prior to its reaching the surface, the portion of the conductor's adhesive coating which is to be placed in contact with the surface is activated. The conductor itself should not be affected by the adhesive activating energy. The conductor is brought into close proximity with the substrate surface subsequent to or simultaneously with activation. The activated portion of the adhesive coating contacts and adheres to the substrate surface, forming a bond between the conductor and the substrate surface.

The energy used for activating the adhesive coating should be controllable in magnitude and intensity. The level of the energy should be sufficient to activate the adhesive, but not to damage the conductor or the substrate surface. Thermal, ultrasonic or radiant energy sources, or combinations thereof, may be used. The adhesive may be activated chemically using a solvent directed at a portion of the adhesive coating. Alternatively, heated or superheated gasses such as air may be directed at the coating to supply thermal energy to activate the adhesive.

Radiant energy sources which can be used in the practice of this invention include laser, and focused infrared radiation. The activating sources may be used alone or in combination.

The preferred activating energy source is one or more laser beams. The energy output and spot size of the laser beams is controllable. A laser beam may be directed at a selected portion of the adhesive coating on the surface of the conductor needed to form a bond with the substrate. A multiplicity of energy beams (which can include lasers, different types of lasers or other beams) or beam splitting techniques can be provided. One energy beam may be used for activating the adhesive coating while another energy beam may be used for other purposes such as stripping or soldering.

In order to activate the adhesive coating, an energy beam, preferably a laser beam, is directed to a point on the conductor at or before the projected point of contact between the conductor and the substrate surface. The adhesive coating is activated at or prior to contacting the substrate surface such that it is in a tacky state when the conductor contacts the surface.

Preferably, a laser beam is used for activating the adhesive coating; more preferably, a $CO_2$ laser beam which emits infrared radiation should be used. The laser energy should be directed at the desired requisite area on the adhesive coating i.e. the underneath portion adjacent the substrate contact point, and discharged in the form of a pulsed beam. The pulses can be created by interrupting the emission of a continuous wave laser beam by turning the power on and off, or by "Q-switching" using electro-optic or mechanical shutters or acousto-optic couplers.

The laser beam pulses are preferably uniform pulses with an energy content adjusted for existing conditions (e.g. beam focus, adhesive activation requirements etc.) so the energy is sufficient to activate the adhesive without damaging the conductor or surrounding surfaces. Therefore, the product of the pulse amplitude (energy level), and pulse width, (pulse duration) should be constant. The "spot size" should be chosen as the minimum diameter large enough to allow easy alignment with the conductor. Larger spot sizes diffuse energy due to the Gaussian energy distribution of the beam and, hence, are undesirable. The pulses are preferably discharged at such a rate that the spots partially overlap on the conductor so as to expose and activate the adhesive coating efficiently and evenly. In other words, a pulse should be emitted each time a predetermined length of conductor is traversed.

Once spot size has been chosen, pulse amplitude and pulse width are adjusted to produce sufficient energy to activate the exposed area of adhesive coating without damaging surrounding surfaces. The adjustment of the pulse energy content also takes into account conditions such as laser efficiency, wire size, and the particular adhesive requirements. Since the number of pulses is constant per uniform length, the pulse repetition rate is a function of the speed at which the wire is being scribed.

If a 20-watt continuous-wave $CO_2$ laser is used, and the scribing speed is between about 200 and 600 inches/minute, the pulse width selected should be about 200 to 2000 microseconds, pulse repetition rate about one pulse per 0.10 to 0.25 mm (0.004 to 0.010 inches) and the spot size selected should be from about (0.5 to 2.5 mm (0.020 to 0.100 inches) in diameter. If wire handling equipment is fast enough, bonding speeds as high as 1000 inches/minute can be achieved. Additional information regarding pulsed laser adhesive activation is included in copending application "Method of Manufacturing Interconnection Circuit Boards" (Morino et al).

Scribing speed may vary often and considerably during the scribing process. When the scribing process begins, there is an acceleration to running speed, during which time the velocity varies constantly; if there is an inflection point along the path of the conductor, there is a deceleration to a stop while the inflection is made and subsequent acceleration to running speed. If the energy dispensed to the adhesive coating were not varied according to variations of scribing speed, the activation of different areas along the adhesive coating of the conductor would be inconsistent. Emission of a fixed number of constant energy pulses per uniform length of movement obviates these problems. Each unit area of the conductor receives the same amount of energy regardless of the scribing speed.

After contact of the conductor and adhesive coating with the substrate surface the adhesive coating loses energy and reverts to a solid non-tacky condition thus bonding the conductor to the substrate. The conductor is scribed between terminal points in this fashion.

After the conductor pattern is fixed onto the substrate, a separate curing step may be performed. The coating may be cured by baking, exposure to heat, ultraviolet radiation and the like. The adhesive coating of the scribed conductors preferably includes a curing agent which is non-reactive under conditions that activate the adhesive during the scribing operation but which can be made reactive to provide a permanent thermoset bond at higher termperatures or by applying ultraviolet radiation.

EXAMPLE 1

An elongated preformed wire conductor, for example, a copper wire of 38 awg (American Wire Gauge, or 0.1 mm diameter) plated with approximately 0.5 micrometers of silver is covered with a layer of polyurethane insulation, 38 micrometers thick. The conductor is further provided with an adhesive coating having the following dry weight composition: 100 g high molecular weight polyurethane acrylate, 15 g epoxy acrylate, 9.8 g of a polyisocyanurate of toluene di-isocyanate, 3.5 g ultraviolet curing agent, and 0.5 g 4-methoxyphenol.

The corresponding wet weight composition, ready for coating, is as follows: 333.3 g high molecular weight polyurethane acrylate (32% solution), 15 g epoxy acrylate, 19.6 g polyisocyanurate (50% solution), 3.5 g ultraviolet curing agent, 0.5 g 4-methoxyphenol and toluene in the amount of 7 weight percent of the total.

The adhesive coating composition is applied to the insulated conductor by repeatedly passing the conductor through the wet adhesive coating composition and a series of diamond dies of increasing diameter. The first diamond die in the series is provided with an orifice 152 micrometers in diameter. The next die which the conductor is to pass through is provided with an orifice 6.4 micrometers larger in diameter than the first. The wire conductor is passed through the wet adhesive coating composition, then through a diamond die, then an oven to remove residual solvents from the applied adhesive coating. This process is repeated with dies having increasingly larger orifices until the conductor diameter is 266.7±5.1 micrometers (0.0105±0.0002 inches). The wire conductor is then spooled for storage. The adhesive is sufficiently flexible to allow radii of bending in the range of 0.12-0.25 mm. After the wire conductor is scribed in a predetermined pattern on the surface of a substrate, the adhesive coating can be cured by exposure to an ultraviolet light source of at least 15 joules/$cm^2$.

EXAMPLE 2

A wire conductor is coated in accordance with the method described in Example 1 with an adhesive coating having the following dry weight composition: 100 g Adcote TM 76P1 (polyester having molecular weight of about 25,000 available from Morton Chemical Co.), 30 g blocked isocyanate commercially available as Desmodur VP KL5-2371 available from Mobay Chemical Corporation, 7.5 g fumed silica (commercially available as Cab-O-sil ™ from Cabot Corp.), 5 g zirconium silicate, 1.5 g orange pigment and 20 g methylethyl ketone (MEK) solvent and having a wet weight composition of 192.3 Adcote 76P1 and 40 g blocked isocyanate, 7.5 g Cab-O-sil ™, 5 g zirconium silicate, 1.5 g orange pigment and 20 g MEK.

The adhesive coated wire conductor is fed through a wire scribing head. The substrate on which the conductor is to be scribed is a standard printed circuit board having on its surface etched areas where copper has been etched to leave epoxy, a copper conductor pattern and solder mask. As the conductor is fed through the scribing head, a stream of hot air having a temperature of about 120°–150° (250°–300° F.) is aimed at the conductor in order to activate the adhesive coating. The hot air stream is aimed at a point on the conductor which will melt and contact the surface. The adhesive coating remains melted and, therefore, activated for approximately 0.5 seconds. The scribing speed is about 13 mm (0.5 inches) per second. The hot air stream is therefore aimed at a point on the conductor approximately 1.5 mm (0.060 inches) above the surface, allowing the adhesive coating to melt continuously as the conductor is continuously fed through the scribing head and through a roller. The roller serves to impress the conductor onto the surface. The adhesive coating is still fluid when the conductor contacts the surface. The adhesive coating resolidifies and become non-tacky within about one second, thus bonding the conductor and maintaining its positional stability. After the conductor has been scribed in the predetermined pattern, the adhesive coating is fully cured by baking in an oven at a temperature of 150° C.

EXAMPLE 3

A wire conductor coated with the adhesive coating described in Example 2 is scribed to the surface of an epoxy gloss laminate substrate as described in Example 2. However, instead of using a hot air stream to activate and melt the adhesive coating, an ultrasonic transducer is used as the activating energy source. The ultrasonic system includes an ultrasonic generator, a power supply, a coil, a transducer, feedback elements and a stylus tip. The conductor is fed through the scribing head and the stylus tip, which has a groove under which the conductor fits. The ultrasonic transducer produces mechanical vibrations at a rate of about 25,000 Hz. These vibrations are converted into heat, which melts the adhesive coating not only at the point of contact between the stylus and the conductor, but at the point between the conductor and the surface. The melted adhesive coating adheres to the board as it contacts the surface.

EXAMPLE 4

A wire conductor coated with the adhesive coating described in Example 1 is to be scribed onto a printed circuit board in accordance with the method of Example 2. However, a laser energy source is used rather than a hot air stream. A Laakman Electro-Optics, Inc. Model RF 165 laser is used as the laser energy source. The model RF 165 is a sealed $CO_2$ laser having a radio frequency-excited waveguide, a power output of 20 watts CW (continuous wave), a Gaussian ($TEM_{oo}$) beam shape and a maximum modulation frequency of 10 KHz.

The laser energy is discharged at the wire conductor in the form of a pulsed beam. The pulse width of the beam is about 200 microseconds. The pulse amplitude of the beam is about 20 watts. The spot is approximately circular and has a diameter of about 1 mm (0.040 inches). The beam is pulsed when the conductor has been scribed about 0.2 mm (0.008 inches). The scribing speed is about 5 meters (200 inches) per minute. The spot size and pulse frequency are adjusted so that each section of conductor receives about five laser pulses. The activated adhesive coating is contacted with the surface of the substrate and the adhesive coating loses energy, becomes non-tacky and forms a bond with the surface within about 200 milliseconds. When all conductors of the predetermined pattern have been scribed to the board, the adhesive coating is fully cured by exposure to ultraviolet light.

EXAMPLE 5

A wire conductor coated with an adhesive coating is scribed to the surface of a substrate according to the procedure of Example 4. However, the adhesive coating is a mixture of 100 g dry weight or 166.67 as wet weight Purelast ™ 2195 polyether having carboxyl groups adducted onto the polyether backbone and crosslinked with toluene di-isocyanate (available from Polymer Systems Corporation), 166.7 g propylene glycolmonomethylethyl acetate (PMA) and 25 g MEK. The wire conductor is coated in accordance with the method described in Example 1.

EXAMPLE 6

A wire conductor is coated with the adhesive coating composition of Example 1 in accordance with the method described in Example 1. The adhesive coating of the conductor is activated in accordance with the method described in Example 4. However, the conductor is scribed to the surface of a previously fabricated discrete wire interconnection board over existing wires and between two terminal points in order to modify the interconnections on the board.

EXAMPLE 7

A heat activated adhesive was prepared with a blend of a B-staged polymer of a high molecular weight allylic urethane and a B-staged epoxy acrylate. The B-stage mechanism is the reaction of polyisocyanurate with the hydroxyl groups of both polymers. An ultraviolet initiated, free radical curing agent was incorporated in the blend to enable complete curing to a C-stage composition through the allylic and acrylic groups on the polymers. The adhesive was prepared from the formulation below.

| Component | dry solids |
|---|---|
| Polyurethane resin 32% in butanone, the polymer was hydroxyl terminated with allylic groups evenly spaced the polymer chain; the repeating molecular weight was approximately 1000 and the hydroxyl no. was 11.3 mg KOH/g (commercially available as S126–224 ™ from Bostick Div. of Emhart Chemical Group, Middleton, MA.) | 315 g |
| Bisphenol A epoxy diacrylate ester with a weight of 834 (commercially available as CMD 3703 ™ from Celanese Specialty Resins, Louisville, Kentucky.). The chemical formula is believed to be | 15 g |

-continued

| Component | dry solids |
|---|---|
| $CH_2=CH-CO-[O-CH_2-$<br>$CHOH-CH_2-O-C_6H_4-$<br>$C(CH_3)_2-C_6H_4-O-CH_2-$<br>$CHOH-CH_2-O-C_6H_4-$<br>$C(CH_3)_2-C_6H_4-O-CH_2-CHOH-CH_2-$<br>$CH_2-]_2-O-CO-CH=CH_2$ | |
| Polyisocyanurate of toluene diisocyanate 50% in butyl acetate (commercially available from Mobay Chemical Corp, Pittsburgh, PA as Desmodur IL ™ | 19.6 g |
| 2,2-dimethoxy-2-phenylacetophenone (commercially available as Irgacure 651 ™ from Ciba-Geigy Corp.) | 2.5 g |
| 4-methoxyphenol toluene 7% by weight of the total formulation | 0.5 g |

The diacrylate epoxy ester (15 g) was reacted with polyisocyanurate solution (9.6 g) for 3 hours at 95° to B-stage the epoxy acrylate resin by crosslinking the hydroxyl groups. This produced a B-stage epoxy acrylate polymer with an average molecular weight of 5400.

The allylic polyurethane resin was reacted with 10 grams of polyisocyanurate solution for 1 hour at 95° C. This polymerized resin to a B-stage polymer with an average molecular weight of The two B-stage polymers were combined and refluxed for 1 hour at 95° C. Butanone was added as necessary to control viscosity.

After refluxing the B-stage polymers together, the solution was cooled and 3.5 grams of 2,2 -dimexthoxy 2-phenylacetophenone and 0.5 grams of 4-methoxyphenol dissolved in 30 grams of butanone were added to the polymers. The weighing dish used to weight the 2,2-dimethoxy-2- phenylacetophenone and 4-methoxyphenol was washed three times with 20 grams of butanone and the wash solvent was also added to the polymer solution. The solution was then mixed thoroughly for 30 minutes and weighed. 7% by weight toluene was added, and then the solution was mixed for an additional 30 minutes.

Copper wire 0.1 mm in diameter covered with a layer of polyurethane insulation to a diameter of 0.14 mm was coated with a uniform layer of adhesive by passing the wire repeatedly through the adhesive solution, drawing the wire through a diamond die and passing it through an oven to dry the coating and remove residual solvents. For each repetition of the process the diamond die was of larger diameter. The first die was 0.152 mm diameter and the diameter of each succeeding die was 0.0063 mm larger than the previous die. The coating process was continued until the outside diameter of the wire with the dry, heat activated adhesive coating was 0.26 mm to 0.27 mm. The wire was coated and stored in areas where ultraviolet light was excluded. The wire was wound on a spool for storage until use. The heat activated adhesive coating on the wire did not block in storage.

The wire coated with the heat activated adhesive was wire scribed to printed wiring boards to modify the conductive pattern. During the scribing process the wire was automatically placed on and bonded to the surface of the printed wiring board. The surface of the printed wiring boards comprised solder mask areas, epoxy substrate areas and exposed metal areas. The printed circuit was mounted on a moveable work table. The wire was fed out on the printed wiring board surface from a scribing head assembly. The wire was laid on the substrate by moving the work table relative to the scribing head assembly and by rotating a scribing feed mechanism in a predetermined direction. The wire scribing head assembly and the table were numerically controlled.

As the wire was fed toward the surface, and just prior to its reaching the surface, the portion of the heat activatable adhesive coating which would contact the surface was exposed to a beam from a $CO_2$ laser (Model RF 165 ™ from Laakman Electro-optics, Inc.). The laser was a sealed $CO_2$ laser with a radio frequency excited wave guide, a power output of 20 watts CW (continuous wave), a Gaussian energy distribution, and a maximum modulation frequency of 10 kHZ.

The laser energy was discharged at the wire in the form of a pulsed beam. The pulse amplitude of the beam was about 20 watts. The spot was approximately circular and had a diameter of about 1 mm. The beam was pulsed when the wire had been scribed about 0.2 mm. The scribing speed was about 5 m/min. The spot size and pulse frequency were adjusted so that each section of heat activatable adhesive coated wire received about five overlapping laser pulses. The activated adhesive coating contacted the surface of the printed wiring board and the adhesive coating became nontacky and formed a solid bond with the surface in about 200 milliseconds.

The wire was securely bonded by the heat activated adhesive to the solder mask, epoxy substrate and exposed metal areas as well as to other scribed wires. When all the wires to modify the conductive pattern had been scribed to the printed wiring boards, the boards were exposed to 19.5 joules/cm$^2$ of ultra violet light to cure the heat activated adhesive to the C-stage.

Printed wiring boards with the wire scribed conductors were soldered at 265° C. for 10 seconds. There was no failure of the adhesive bond between the wires and the substrate, and no visible evidence of attack on or damage to the adhesive coating. Printed wiring boards with wire scribed conductors were placed in dichloromethane for 10 seconds, dried in air at ambient temperature for 10 minutes and examined with the aid of a microscope. There was no failure of the adhesive bond between the wires and the substrate, and no pitting, crazing or other indication of attack on the adhesive coating.

EXAMPLE 8

A heat activatable adhesive was formulated from a polyester resin believed to have a molecular weight of about 20,000 and a hydroxyl functionality of 2, and a blocked isocyanate for a C-stage or the final cure. The ratio of resin to blocked isocyanate was 10:3. The formulation is as follows:

| Component | weight |
|---|---|
| Polyester adhesive resin with dihydroxy functionality and average molecular weight of 20,000 prepared from isophthalic acid and a nine carbon dibasic acid esterified with ethlene glycol and diethylglycol as a 51% solution in butanone commercially available as Adcote 761 ™ from Morton Chemical Corp.) | 192 g |
| Blocked aliphatic isocyanate which will unblock 100–110° C. (The blocked polyisocyanate is 75% solids dissolved in a 50/50 mixture of xylene and 2-ethoxyethylacetate commercially available from Mobay Chemical Corp., Pittsburgh, PA as Desmodur VP KL 54-2371 ™.). | 40 g |
| Fumed silica (commercially available from Cabot | 7.5 g |

| Component | weight |
|---|---|
| Corp., Tuscola, IL as CAB-O-SIL TM) | |
| Zirconium silicate powder average particle size 0.55 micrometers (commercially available from TAM Ceramics Inc., Niagara Falls, NY as Excelopax TM.) | 5 g |
| Fluorescent pigment (commercially available as Day-Glo Orange TM from Day-Glo Color Corp., Cleveland, OH) | 1.5 g |

The ingredients were milled together on a three roll paint mill and diluted with 20% solids with methyl ethyl ketone for coating on wire.

Insulated wire 0.14 mm in diameter with a copper core 0.1 mm in diameter was overcoated with a layer of the heat activatable adhesive and dried with forced hot air. The application of adhesive was repeated until the diameter of the wire plus the heat activatable adhesive was increased to 0.27 mm (at least 85% larger than the original diameter).

The heat activable adhesive coated wire was scribed onto the surface of an glass cloth reinforced epoxy laminate type FR-4 using a numerically controlled wire scribing head assembly and work table similar to Example 1. A hot air jet (air heated to a temperature of 120° C. to 150° C.) was used to activate the adhesive layer instead of the laser beam used in Example 7, and the roller on the scribing head was used to place the activated adhesive coated wire in contact with the FR-4 surface as in Example 7.

After wire scribing the FR-4 laminate was heated to at least 120° C. to crosslink the adhesive forming an infusible bond between the wire and the FR-4 laminate capable of withstanding molten solder at 288° C. for 10 seconds. The laminate was heated in three stages to crosslink the adhesive: 45 minutes at 85° C., 45 minutes at 12° C., and 45 minutes at 155° C.

The wire scribing is repeated except that instead of activating the adhesive layer with a laser beam or a hot air jet, the adhesive layer is activated ultrasonically. The ultrasonic system includes an ultrasonic generator, a power supply, a coil, a transducer, feedback elements and a stylus tip. The heat activatable adhesive coated wire is fed through the scribing head and the stylus tip, which has a groove under which the adhesive coated wire fits. The ultrasonic transducer produces mechanical vibrations at a rate of about 25 kHz. These vibrations activate the adhesive coating and adhere the wire to the FR-4 substrate.

EXAMPLE 9

A heat activated adhesive coating composition was prepared based on a diacrylate ester of a diepoxy bisphenol A resin combined with a solid expoxy resin. The diacrylate ester resin was CMD 3703 TM. The solid expoxy resin (EpiRez 540C TM commercially available from Celanese Coatings and Specialities Co.) had an epoxy equivalent weight of 1600.

In order to make a non-blocking adhesive formulation, the molecular weight of the epoxy resin was increased from about 3,200 to over 35,000 by reacting it with a polyamide curing agent. Similarly, the molecular weight of the diacrylate ester (CMD 3703) was modified with 3 grams of a polyisocyanurate (Desmodur IL TM) per 100 grams of epoxy acrylate ester to partially cure or B-stage the system and increase the molecular weight from 830 to about 5,500. The expoxy acrylate ester and the polyisocyanurate were refluxed at 80° C. for 30 minutes to B-stage the epoxy acylate ester before adding the other components of the adhesive.

A free radical initiator was also added to the heat activated adhesive formulation to cure the adhesive to the C-stage after it has been used to bond scribed wires to a board. For thermal curing, dicumyl peroxide was added. Dicumyl peroxide generated free radicals at temperatures in excess of 150° C. For ultraviolet light curing, 2,2-dimethoxy-2-phenylacetophenone was used as a free radical generator. The adhesive was refluxed at 80° C. for 30 minutes to B-stage the adhesive before coating the wire.

The final formulation was:

| Component | weight |
|---|---|
| Epoxy diacrylate ester (CMD 3703) | 40 g |
| Diglycidyl ether of bisphenol A, expoxy equivalent weight 1600 (EPIREZ 540C) | 60 g |
| MODAFLOW TM (a flow promoter commercially available from Monsanto Co., believed to be a low molecular weight butyl acrylate) | 1.3 g |
| FLUORAD 430 TM (a perfluorinated surfactant commercially available from 3M Corp.) | 0.3 g |
| Polyamide curing agent with an approximate equivalent weight of 140, believed to be the reaction product of 3 moles of linoleic acid dimer and 4 moles diethylene triamine (commercially available from Shell Chemical Co. as Epon V-40 TM) | 5 g |
| Polyisocyanurate, 50% solution (DESMODUR IL TM) | 1.2 g |
| Dicumyl peroxide | 0.5 g |
| 2,2-dimethoxy-2-phenylacetophenone (IRGACURE 651 TM) | 2.5 g |
| 4-methoxyphenol | 0.5 g |

This composition was dissolved in methyl ethyl ketone to make a solution with 20 percent solids. The solution was applied to an insulated wire with an outside diameter of 0.14 mm, and the adhesive coating was dried with forced air at 65° C. the overall diameter of the wire was increased to 0.23 mm (64%). The heat activatable adhesive coated wire was scribed to an FR-4 substrate with hot air jet activation, as in Example 2. The adhesive bond of wire to the substrate was much lower than Example 2.

Wires coated with the same adhesive solution to obtain a overall diameter of 0.26 mm (85% increase). Good adhesion was obtained by scribing wire of 0.26 mm diameter, showing that heavier coating of adhesive on the wire is preferable to achieve superior bond of scribed wires to the substrate.

EXAMPLE 10

A length of 34 awg copper wire (0.16 mm in diameter with 0.02 mm insulating layer) was drawn through a reservoir of a molten thermoplastic adhesive, hot melt glue (Instaweld TM 34-3131 commercially available from National Starch and Chemical Corporation). The wire was then drawn through a die having a diameter of about 0.3 mm which cooled and soldified the adhesive coating. The wire was then heated.

The adhesive coated wire was scribed to a substrate of epoxy glass in accordance with the procedure set forth in Example 2 except that the hot air stream was maintained at a temperature of between 350° and 450° F. The conductor bonded well to the epoxy glass.

EXAMPLE 11

The strength of the bond between the adhesive coating of a conductor and the substrate surface to which it was bonded was measured using an Instron machine Model 1130. The measurement was performed using a continuous vertical perpendicular peel. The vertical speed of the peel was 10 in/minute. A ten-pound load cell was used. The sensitivity setting of the machine was 0–1 pound and the strip chart was calibrated such that 0–10 on the chart represented 0–1 pound. A wire conductor having an adhesive coating of the formula of Example 5 was scribed to a Vacrel solder mask using a $CO_2$ laser which was pulsed once every 6 thousandths of an inch. The adhesive coating was fully cured with ultraviolet light. The average peel strength of the bond was found to be 40 grams in a straight line. Generally, the peel strength of the adhesive coating after full cure should be between about 30–60 grams in a straight-line scribed conductor.

Wire Stripping

When the conductor is an insulated metallic wire, electrical and mechanical terminations are made at each terminal points on the substrate. The metal core of the insulated wire is exposed in order to make the termination. The adhesive coating and insulation layers are stripped to expose the conductive portion.

Selected portions of an insulated wire may be stripped of coating or insulation by mechanical stripping, using two opposing knife edges brought close enough together to penetrate the conductor coatings without damaging the conductive portion of the conductor. The knives then slide along the conductor to scrape off excess material. Another technique used for mechanical stripping is an abrasive jet: abrasive particles are sprayed at high velocity in a concentrated stream on the conductor to remove the insulation layer and adhesive coating.

A conductor's insulation layer and adhesive coatings may be chemically stripped using a solvent. Excess solvent is preferably removed after stripping.

Other stripping methods include low temperature and high temperature thermal stripping. These methods include localized short term exposure of the conductor coatings to relatively high temperature energy sources. Some examples of high temperature energy sources include lasers, electrical arcs, and flame sources such as torches and the like.

Preferably, adhesive coating and insulation stripping is accomplished with a laser beam. The energy of the impinging laser beam strips the conductor, vaporizing the coatings. There are at least two methods of removing the adhesive coating and insulation layer using laser energy. According to a first laser method, a laser beam with a spot size large in comparison to the diameter of the conductor is aimed and pulsed at least once at the section of the adhesive coating to be removed. Although the large spot size results in a relatively large area for stripping, the laser energy may be so diffuse along the outer edges of the spot that it may not be sufficient to vaporize completely the adhesive coating and insulation layer. Increasing the duration of the laser beam radiation for better vaporization may cause heat conduction along the conductor, causing the adhesive coating to bubble and boil beyond the irradiated area. This method may also entail damage to the environment surrounding the conductor due to the large area of the spot. Equipment, surrounding conductors and portions of the substrate surface may be damaged.

According to a second more preferred laser method, a small spot is scanned along a predetermined length of conductor by moving the laser beam along the stationary conductor or by moving the conductor, keeping the beam stationary, or moving both. This results in a higher energy concentration for the same laser output power. This method appears to remove the coatings more efficiently leaving a cleaner metal surface. Preferably, the diameter of the spot is approximately five times the diameter of the conductor if a $CO_2$ laser beam is used. Further, the frequency of the scanning can be adjusted according to the different materials to be removed. A vacuum may be used to remove debris such as fillers. A gas jet is preferably employed to blow off the residue left on the conductor. The laser stripping process is preferably coordinated with the table motion to provide a predetermined cleaned length in concert with that motion.

A reflector placed on the side of the conductor opposite the side from which the energy is discharged can be used to strip the far side of the conductor. Alternatively, multiple laser beams can be aimed at opposed sides of the conductor or the conductor can be rotated to remove adhesive coating and insulating layer all around the conductor. Energy can be conducted through the conductor to remove the adhesive coating and/or insulation layer.

An infra-red laser may be used for stripping However, an Excimer TM laser source emitting ultraviolet radiation is also suitable in the stripping process. A laser beam from an Excimer laser source can vaporize the organic materials coating the wire conductor in a process termed "photodecomposition" without affecting the conductor.

After the conductor endpoints are stripped, they can be electrically and mechanically connected to a terminal point. Termination of the conductor can be accomplished according to any method known to those of skill in the art. Terminal points can be surface pads, holes or apertures with or without metallized walls, conductive cavities, component leads, conductive fingers or the like. Surface pad termination may be used to interconnect surface attached components, or to modify circuit boards having circuit holes in which the holes are already filled with solder. Termination of a scribed conductor to a surface pad can be accomplished by solder reflow methods, heating, laser soldering, welding or the like.

The stripped end of a scribed wire conductor can be inserted into a circuit hole and electrically and mechanical terminated by soldering, heating with a laser or the like.

Termination may also be accomplished by mechanically drilling through wires to form holes in the substrates and then metallizing, or plating, the drilled hole.

Leaded components may be inserted into circuit holes on the substrate after the wire conductors have been inserted in the holes and prior to termination. The components may be inserted either manually or automatically. Both a component lead and wire conductor end may reside in the same circuit hole. Once the components are placed, the circuit holes are manually or automatically filled with solder. Circuit holes may be filled with solder using a wave soldering machine. This automatically produces solder joints between the wire conductor and component leads, or, where circuit holes are metallized, between the wire conductor, wall metallization and the component lead.

The adhesive coated conductor may be stripped before placement on a surface or stripped just prior to termination. Preferably the wire is stripped and cut by an appropriate apparatus just prior to termination. Thus, a conductor may be scribed and stripped along a length sufficient to provide metallized wire for two endpoints: one to end a scribed length of conductor and another to begin a new length of conductor. The conductor is cut at a middle point along the stripped section for this purpose.

The process of this invention may also be used to modify or make a circuit board provided with "parallel holes." These circuit boards possess a set of plated through holes which are electrically connected to a corresponding first set of plated through holes. When constructing or repairing boards having parallel holes, the stripped ends of the conductor should be inserted into the duplicate holes and soldered.

Circuit Board Modification

Figure 1A:
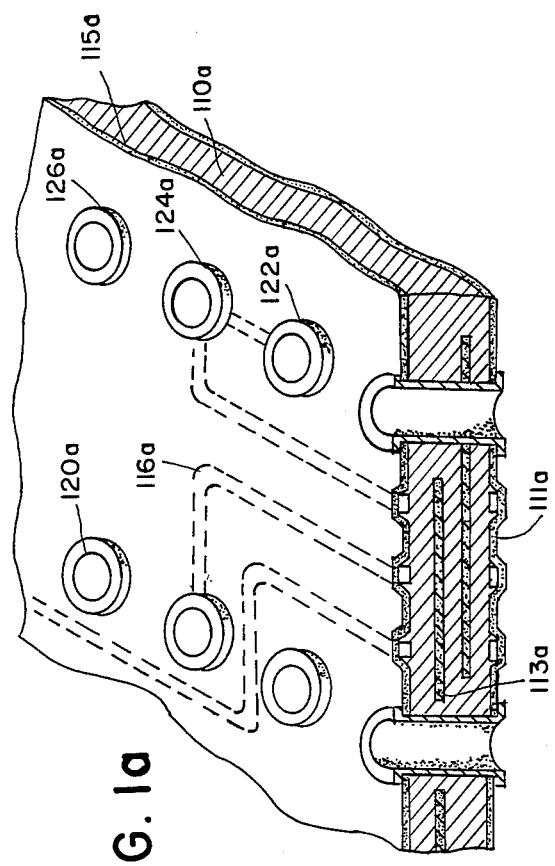

FIG. 1a shows an interconnection circuit board 110a having etched power and ground planes 111a and 13a on which conductors 116a have been placed. A dielectric layer with surface 115a has been applied over the conductors. Circuit holes 120a have been drilled and the hole walls metallized in order to provide electrical access between the conductors 116a and the conductors on the opposite surface as well as the outside world. If it is desired to modify the circuit board depicted in FIG. 1a, such modification can be accomplished according to the process of this invention as described below.

FIG. 1b shows the interconnection circuit board 110a of FIG. 1a as modified in accordance with the process of this invention. Conductor 130b having adhesive coating 140b is applied, for example, to surface 115b along the predetermined route from circuit hole 126b to circuit 128b. The adhesive coating 140b is removed by stripping, e.g. with a laser, from conductor 130b prior to the conductor's insertion into circuit hole 126b. at segment 132b. Segment 132b is inserted into circuit hole 126b and the adhesive coating 140b activated, e.g. with a repeated laser beam pulse. The conductor 130b is then scribed onto surface 115b. The now tacky, activated adhesive coating, provides continuous adhesion as it is scribed and contacts surface 115b between the conductor 130b and the surface 115b. Conductor 130b is scribed in a predetermined pattern until it reaches circuit hole 128b. At plated through hole 128b, adhesive coating 140b is again stripped from conductor 130b, leaving the conductor exposed at segment 134b. Segment 134b is inserted into plated through hole 128b.

The connection between circuit holes 122b and 124b has been severed by drilling a hole 150b into the board. An additional conductive path is similarly provided by applying adhesive coated conductor 135b in a defined, predetermined and repeatable location reaching from terminal point 122b to terminal point 129b. Both terminal points are metallized circuit holes. Connection to hole walls is made by known technologies and preferably by soldering, welding or the like.

Figure 1C:
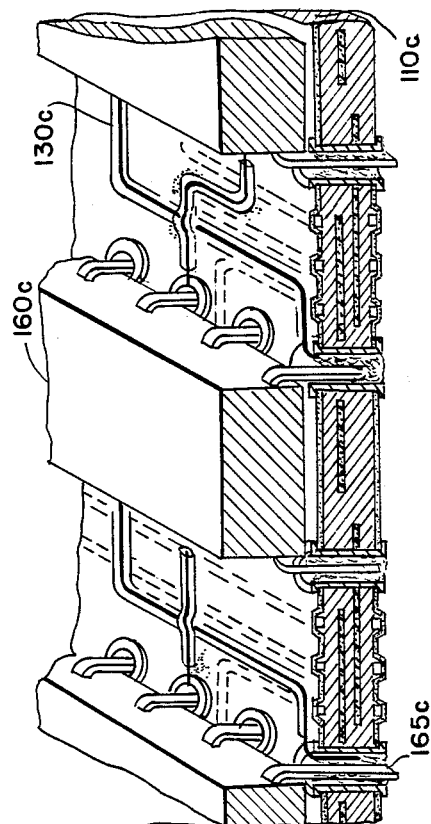

FIG. 1c depicts modified interconnection circuit board 110c after modification conductor 130c has been placed as shown in FIG. 1b. Once the modifications are made, components 160c may be placed in the circuit holes of the interconnection circuit board in the appropriate locations. A component lead 165c can occupy the same circuit hole barrel as conductor 130c. Once the conductors and the components are in place, electrical and mechanical termination can be made by soldering, for example.

Figure 1D:
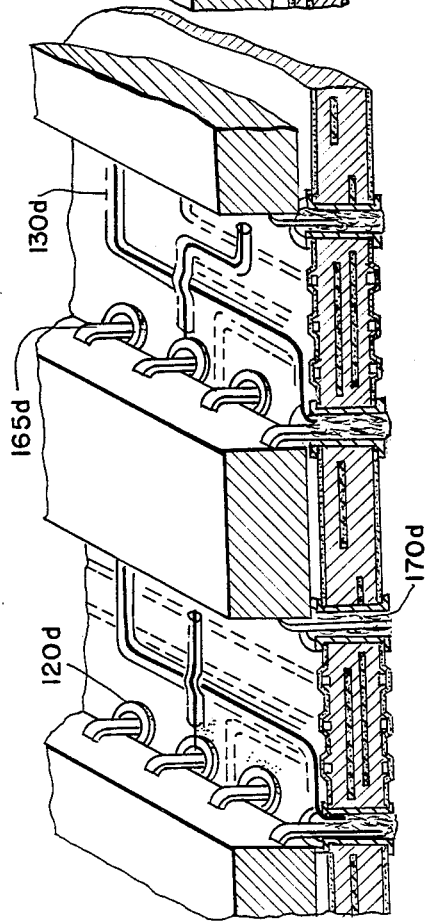

FIG. 1d depicts the interconnection circuit board after electrical and mechanical interconnection has been made by soldering. The component leads 165d and conductors 130d have been soldered into circuit holes 120d, leaving a fillet of solder 170d. Solder fillet 170d provides electrical and mechanical interconnection.

Figure 1E:
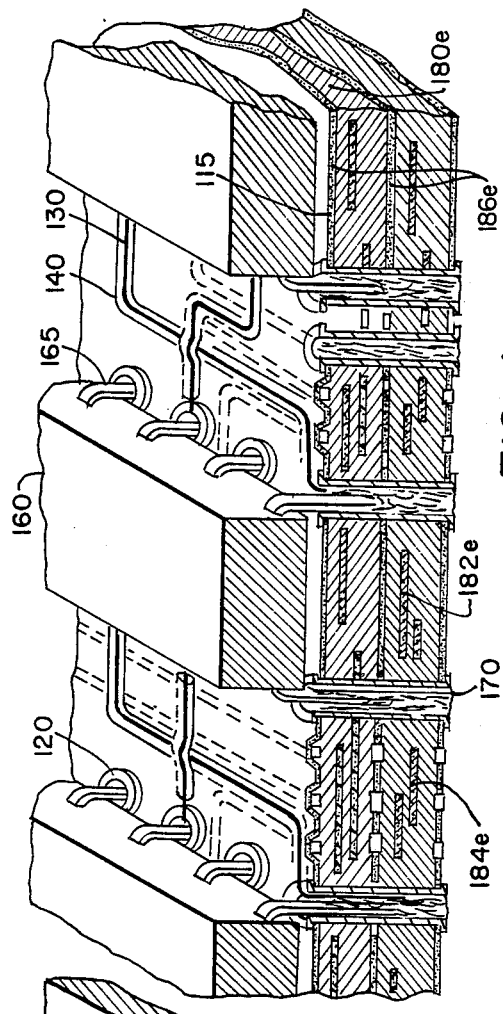
FIG. 1e is a perspective view with partial cut-aways of a modified multiple layer interconnection circuit board showing three layers of circuit patterns, inserted components and a via connecting the layers.

FIG. 1e depicts a multiple layer interconnection circuit board 180e having an etched power layer 182e, an etched ground layer 184e and an etched signal layer 116e. Modification conductors 130 have been scribed to the surface of board 180e to provide a new signal interconnection pattern.

Figure 2A:
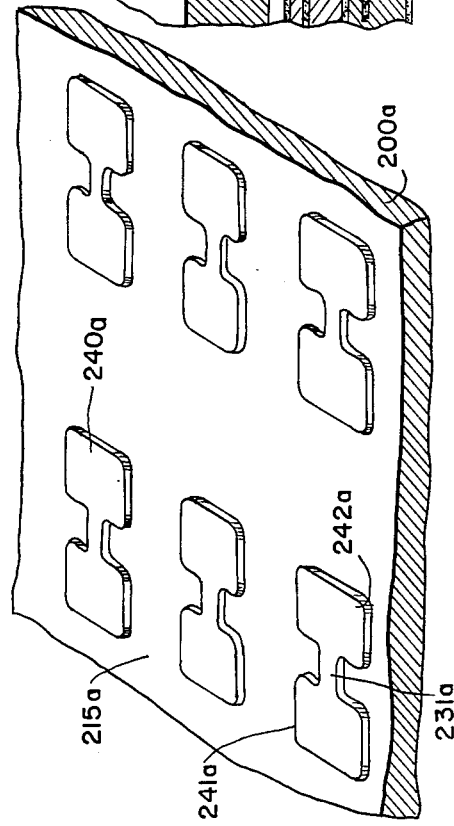
FIGS. 2a through 2c show, sequentially, perspective views of modification of a surface-mounted interconnection circuit board.

FIG. 2a shows an interconnection circuit board 200a having surface pads 240a. A short conductor 231a is located on surface 215a and interconnects surface pads 241a and 242a.

Figure 2C:
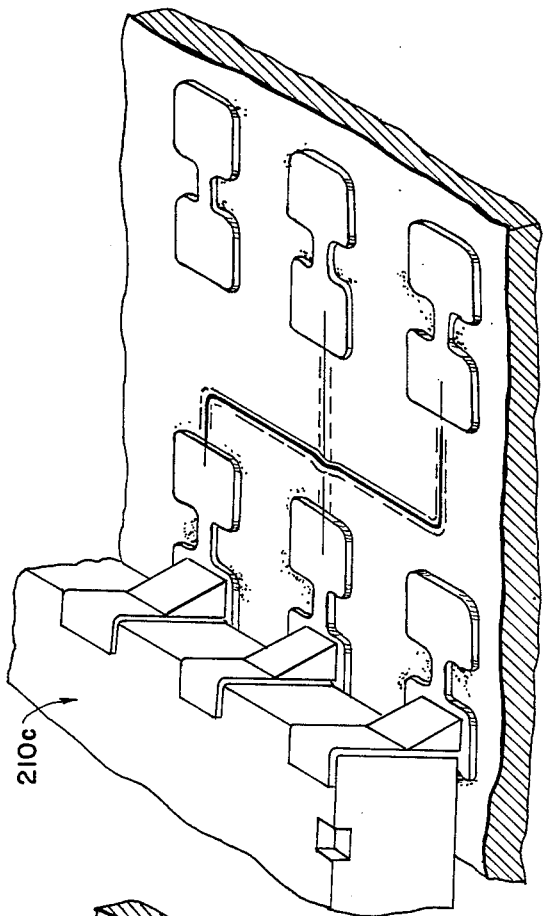
Figure 2B:
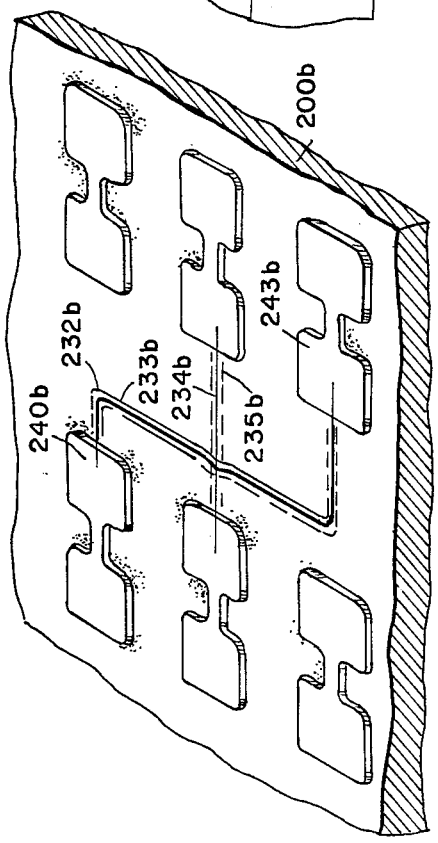

FIG. 2b shows the interconnection circuit board 200a of FIG. 2a as modified in accordance with the process of this invention to add conductors 232b and 234b. A conductor, for example conductor 232b, is first stripped of the adhesive coating and insulation layers at one end and attached to a surface pad 240b by soldering, welding or the like. This attachment provides electrical and mechanical interconnection at the surface pad terminal point. Conductor 232b is then scribed and bonded by the activated adhesive coating 233b along its path. The other end of conductor 232b is then stripped, and attached to surface pad 243b. Conductor 234b is similarly scribed, bonded, and stripped to interconnect the appropriate surface pads. Once the conductor interconnection pattern is formed, the surface-attached components can be placed and attached to the surface pads.

FIG. 2c depicts the completed interconnection board of FIGS. 2a and 2b with surface component 210c attached.

Figure 3A:
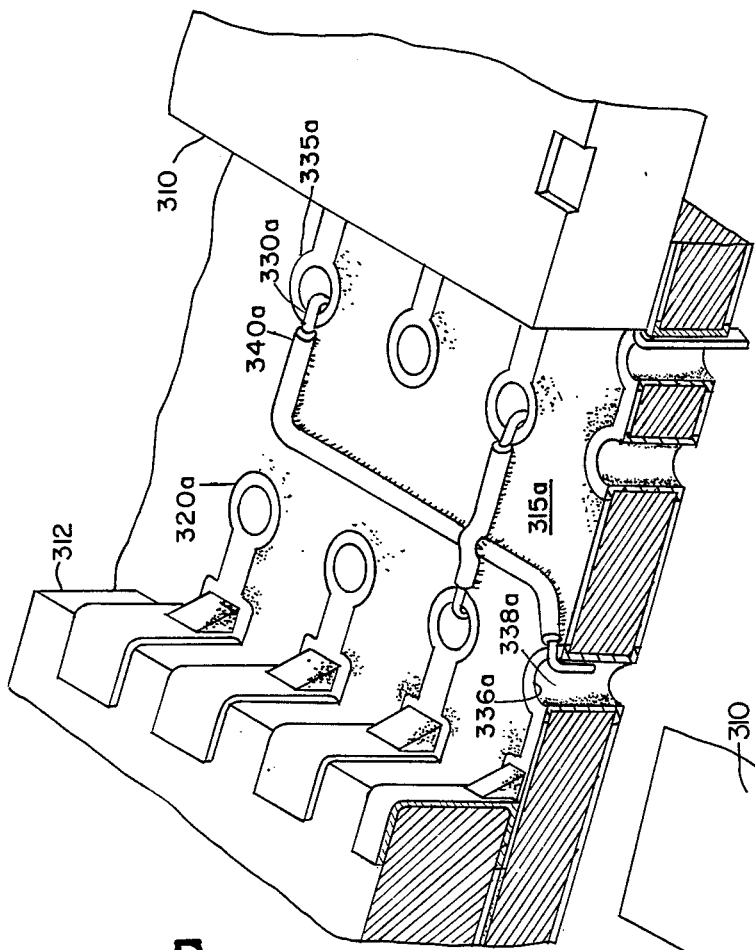
FIG. 3a is a perspective view with partial cut-aways showing a circuit board having six terminal holes and two surface-attached components on which two modification conductors have been scribed.

FIG. 3a depicts modification of an interconnection circuit board on which there is located a surface-attached component 312 and a dual-in-line package 310. Duplicate parallel repair holes 320a were provided in the board design to allow access to terminal points after component insertion. This type of interconnection circuit board can be modified even after components have been attached or inserted. The method for modifying this type of interconnection circuit board is shown in FIGS. 1a–1d.

Conductor 330a having adhesive coating 340a is stripped at one end. The stripped portion is inserted into circuit hole 335a. Conductor 330a is then routed and affixed to surface 315a. When conductor 330a reaches terminal point 336a, it is again stripped and inserted into the circuit hole barrel 338a. Electrical termination can be made as the conductors are inserted into the plated through holes at the terminal points by soldering or the like. However, electrical connection can be made after all the modification conductors have been scribed to the board.

Figure 3B:
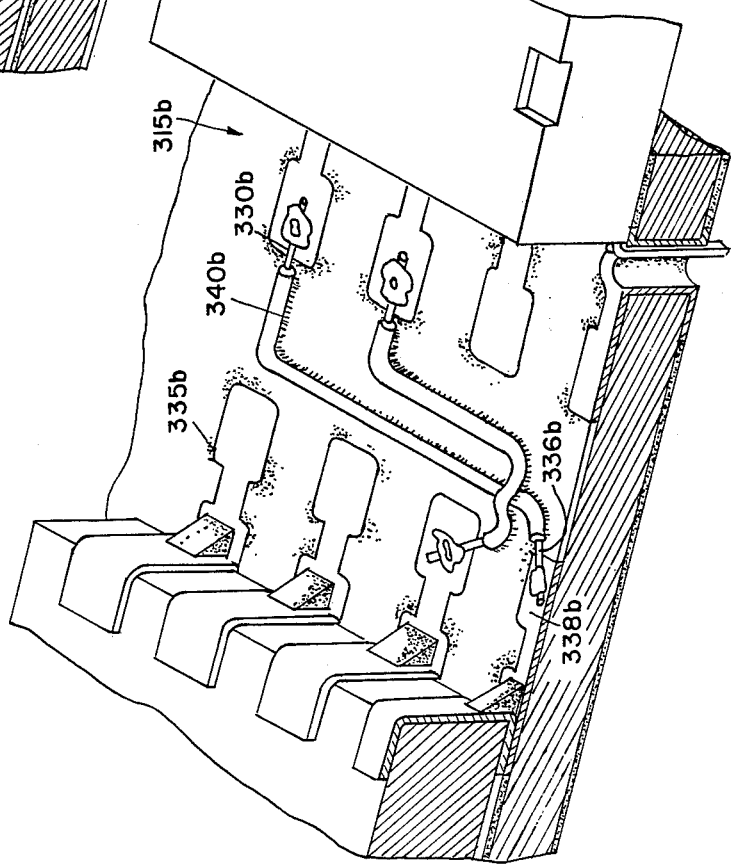
FIG. 3b is a perspective view with partial cut-aways showing a circuit board having conductive surface pads modified after component placement.

FIG. 3b depicts another modification technique for an interconnection circuit board on which there are located surface-attached components and lead inserted components. Duplicate parallel repair surface pads 335b are provided in the board design to allow access to terminal points after component insertion and attachment. This type of interconnection circuit board can be modified using the technique previously described and depicted in FIG. 2.

Conductor 330b having adhesive coating 340b and an insulation layer is stripped at one end. The stripped portion is affixed to a surface pad 335b. Conductor 330b is then routed and affixed to surface 315b by activated adhesive coating 340b. When conductor 330b reaches terminal point 336b, it is stripped at the other end and affixed to surface pad 338b at that terminal point. Electrical termination can be made as the conductors are affixed to the surface pads at the terminal points by soldering or the like.

FIG. 4a depicts a standardized prefabricated panel of pads and holes suitable for various component sizes and component pin densities. The components which are to be used in the circuit are first matched to the existing pads and holes on the circuit board panel. The locations and sizes of the circuit board holes are standardized to accommodate a variety of different circuit configurations utilizing the same basic circuit board panel. The basic panel 410 contains power and ground planes 420a and 430a. Circuit holes 450a are drilled and metallized prior to scribing conductors. Surrounding the holes are conductive pads 470a for eventual termination of conductors.

FIG. 4b depicts basic standardized panel 410 of FIG. 4a with adhesive coated conductors 482b and 484b providing an electrical interconnect. Adhesive coating 486b bonds conductors 482b and 484b to surface 400b. FIG. 4b further illustrates how the adhesive coating 486b provides adequate bonding at crossover 480b of conductors. Adhesive coating 486b appears between conductor 482b and 484b at crossover 480b.

Conductor 482b having adhesive coating 486b is stripped at one end and the stripped portion is affixed to surface pad 472b. Conductor 482b is then routed and affixed to surface 400b. When conductor 482b reaches terminal point 422b, it is again stripped and affixed to surface pad 474b by soldering at that terminal point. Electrical connection can be made as the conductors are affixed to the surface pads at the terminal points by soldering or the like.

FIG. 4c shows the completed circuit board 410c with lead inserted component 465c mounted on the board. The leads 460c of the component are subsequently mechanically and electrically connected to the circuit board 410c by soldering or the like.

FIGS. 5a to 5c illustrate construction of a new circuit board using the process of this invention. FIG. 5b shows the starting circuit board panel with etched power and ground planes 520a and 530a. Circuit holes 540a and 542a are drilled. The holes are then metallized, and surface pads 544a and 546a formed around holes 540a and 542a. Surface pads 548a and 549a are placed on the surface 500a for surface attached components.

FIG. 5b depicts the prefabricated panel 510b as it appears after adhesive coated conductors 582b, 584b, and 592b have been scribed to its surface. The adhesive coating is activated as the conductor is being scribed and serves to bond conductors 582b, 584b and 592b to surface 500b. Adhesive coating 586b also provides adequate bonding at the crossover 580b of conductors 582b and 584b.

Sequentially, conductor 582b can be first stripped at one end and the stripped portion attached to surface pad 572b by soldering. Conductor 582b is then scribed to surface 500b. When conductor 582b reaches terminal point 522b, its endpoint is stripped and soldered to surface pad 574b at that terminal point. Conductor 592b is stripped and soldered to surface pad 544b. This conductor is then routed and soldered to surface 500b and when it reaches terminal point 524b, the other end is stripped and conductor 592b is soldered to surface pad 546b. Electrical connection is made when the conductors are affixed to the surface pads at the terminal points by soldering or the like. Conductor 584b is similarly stripped, scribed and connected. The completed circuit board with components mounted thereon appears as shown in FIG. 5c.

FIG. 6 illustrates another embodiment of the invention wherein adhesive coated conductors are applied to both sides of the circuit board and thereafter encapsulated.

The initial circuit board 610 is constructed including interior ground and power planes 612 and 614 as well as printed surface conductors 618 and 620 which can provide terminal pads and, if desired, a conductor interconnection pattern. Adhesive coated conductors 622 are then added to the upper surface of the board with stripped ends connected to terminal pads like terminal pad 620. Similarly adhesive coated conductors 624 are added to the lower surface with stripped ends connected to terminal pads like terminal pad 618. Thereafter the surface conductors are encapsulated by encapsulating layers 626 and 628. The encapsulated board is then drilled and the drilled holes metalized to provide terminal holes 630 connected to the interior conductors and layers. Components 632 can thereafter be mounted with leads 634 inserted into the terminal holes and connected by solder (not shown).

What is claimed is:

1. A process for scribing at least one conductor onto a surface of a substrate in a predetermined pattern between two points spaced apart on the surface each defining a terminal point comprising:
   a. providing a conductor having an adhesive coating, which is normally non-tacky and non-blocking prior to curing, which can be activated by applying energy thereto, said adhesive coating rapidly reverting to a solid non-tacky condition within about 0 to about 200 miliseconds after activation;
   b. scribing the conductor onto the surface of the substrate from a first terminal point along a predetermined path to a second terminal point;
   c. activating at least a portion of the adhesive coating on the conductor prior to, or simultaneously with contact with the substrate surface so that a bond is formed adhering the conductor to the surface of the substrate when said activated adhesive reverts to said solid non-tacky condition;
   said reversion of said adhesive to a non-tacky state within about 0 to 200 milliseconds permitting the scribing speed along a straight path to reach a potential speed of at least 120 inches per minute while simultaneously substantially avoiding relative movement of the bonded conductors with respect to each other and the substrate surface.

2. A process according to claim 1 wherein said adhesive coating rapidly reverts to a solid, non-tacky condition after activation.

3. A process according to claim 2 further including the step of cutting the conductor after scribing the activated portion of the conductor such that the cut end of the conductor lies substantially at the second terminal point.

4. A process according to claim 1 further including the step of stripping the conductor to expose its conductive portion prior to scribing the conductor.

5. A process according to claim 1 further including the step of stripping the conductor to expose its conductive portion subsequent to scribing the conductor.

6. The process of claim 1 wherein the conductor provided has an adhesive coating comprising three components as a first component a film forming polymeric resin having an average molecular weight between about 10,000 and about 100,000 and having an epoxide, hydroxyl or unsaturated functionality greater than 2, said polymeric resin being selected from the group consisting of polyesters, polyurethanes, polyethers, epoxies, allyl polymers and acrylics;

as a second component a filler, or a polyfunctional compound, or mixtures thereof, said polyfunctional compounds having an average molecular weight below 7,000 and containing a polyphenol backbone, and as a third component a curing agent capable of reacting or initiating a reaction with the functional groups of the polymeric resin to form crosslinks and cure the polymeric resing to a C-stage.

7. A process for making an interconnection circuit board on an insulating base substrate having a plurality of points spaced apart on the surface of the substrate each defining a terminal point comprising:

a. providing at least one conductor having an adhesive coating, the adhesive coating being non-tacky, non-blocking and flexible prior to curing and which can be activated by heat, radiant or ultrasonic energy or by a combination thereof said adhesive coating rapidly reverting to a solid non-tacky condition within about 0 to about 200 milliseconds after activation;

b. activating a portion of the conductor having activated adhesive coating the conductor prior to or simultaneously with scribing the activated portion of the surface;

c. scribing the activated portion of the conductor onto the surface from a first terminal point along a predetermined, precise and reproducible pattern to a second terminal point, thereby adhering the conductor to the surface by means of the adhesive coating;

said rapid reversion of the coating permitting the scribing speed along a straight path to reach a potential speed of at least 120 inches per minutes, simultaneously allowing the conductor pattern to retain dimensional stability.

8. The process of claim 7 wherein the adhesive coating on the conductor comprises three components:

as a first component a film forming polymeric resin having an average molecular weight between about 10,000 and about 100,000 and having an epoxide, hydroxyl or unsaturated functionality greater than 2, said polymeric resin being selected from the group consisting of polyesters, polyurethanes, polyethers, epoxies, allyl polymers and acrylics;

as a second component a filler, or a polyfunctional compound, or mixtures thereof, said polyfunctional compounds having an average molecular weight below 7,000 and containing a polyphenol backbone, and as a third component a curing agent capable of reacting or initiating a reaction with the functional groups of the polymeric resin to form crosslinks and cure the polymeric resin to a C-stage.

9. A process for modifying an interconnection circuit board by scribing at least one conductor onto a surface of the interconnection circuit board in a predetermined pattern beween two points spaced apart on the surface each defining a terminal point comprising:

a. providing an elongated performed conductor having an adhesive coating, the adhesive coating being non-tacky, non-blocking and flexible prior to curing and which can be activated by thermal, radiant or ultrasonic energy or a combination thereof, said adhesive coating rapidly reverting to a solid non-tacky condition within about 0 to about 200 milliseconds after activation;

b. activating a portion of the conductor having activated adhesive coating prior to or simultaneously with scribing the activated portion of the surface;

c. scribing the activated portion of the conductor onto the surface from a first terminal point along a predetermined, precise and reproducible pattern to a second terminal point, thereby adhering the conductor to the surface by means of the adhesive coating;

said rapid reversion of the coating permitting the scribing speed along a straight path to reach a potential speed of at least 120 inches per minute, simultaneously allowing the conductor pattern to retain dimensional stability.

10. The process of claim 9 wherein the adhesive coating on the conductor comprises three components:

as a first component a film forming polymeric resin having an average molecular weight between about 10,000 and about 100,000 and having an epoxide, hydroxyl or unsaturated functionality greater than 2, said polymeric resin being selected from the group consisting of polyesters, polyurethanes, polyethers, epoxies, allyl polymers and acrylics;

as a second component a filler, or a polyfunctional compound, or mixtures thereof, said polyfunctional compounds having an average molecular weight below 7,000 and containing a polyphenol backbone, and as a third component a curing agent capable of reacting or initiating a reaction with the functional groups of the polymeric resin to form crosslinks and cure the polymeric resin to a C-stage.

11. A process according to claim 1, 7 or 9 wherein said energy for activating the adhesive coating is applied by means of a pulsed laser beam wherein the pulses emitted from said laser beam are constant in energy, and the pulse repetition rate is a function of the length of the conductor scribed independent of the scribing speed.

12. A process according to claim 11 wherein said energy for activating the adhesive coating is applied by means of laser energy, hot air or ultraviolet or a combination thereof and wherein said energy means is directed at the projected point of contact between the conductor and the surface of the substrate.

13. A process according to claim 9 wherein the conductor pattern formed by the scribed conductors can be reproduced on a plurality of boards such that the patterns formed have reproducible electrical characteristics.

14. A process according to claim 1, 7 or 9 wherein said adhesive coating is capable of adhering to a plurality of surfaces with different finishes or properties comprising the surface of the substrate to be modified.

15. A process according to claim 1, 7 or 9 where in said adhesive coating is capable of adhering, when activated, to one or more solid surface materials selected from the group consisting of polymer resins, ceramics, glass-bonded metal or carbon conductors, polymer-bonded metal or carbon powder conductors, and conductive polymer materials.

16. A process according to claim 1, 7 or 9 wherein said thermal energy for activating the adhesive coating is applied by means of heated fluid or a solid heat applicator.

17. A process according to claim 1, 7 or 8 wherein said adhesive is a thermosetting resin capable of being C-staged by application of heat or light.

18. A process according to claim 1, 7 or 8 wherein said adhesive is a thermoplastic resin.

19. A process according to claim 1, 7 or 8 wherein said adhesive coating is no activated at a conductor endpoint.

20. A process for scribing at least one conductor onto a surface of a substrate in a predetermined pattern between two point spaced apart on the surface each defining a terminal point, said process comprising:
 a. providing a conductor having an adhesive coating, which is normally non-tacky and non-blocking prior to curing, which can be activated by applying laser energy thereto, and which reverts to a solid non-tacky condition after activation;
 b. scribing the conductor onto the surface of the substrate from a first terminal point along a predetermined path a second terminal point;
 c. activating at least a portion of the adhesive coating on the conductor prior to, or simultaneously with contact with the substrate surface by means of predetermined energy level laser pulses having a constant energy level selected to activate adhesive within the laser beam so that a bond is formed adhering the conductor to the surface of the substrate when said adhesive so activated reverts to said solid non-tacky condition, the pulse repetition rate being adjusted as a function of scribing speed to deliver a fixed number of constant energy pulses per unit length of conductor.

21. A process according to claim 20 wherein the area along the conductor irradiated by each successive pulse overlaps the area irradiated by the preceding pulse.

22. A process according to claim 20 wherein the pulse width of said laser pulses is from about 200 to about 2000 microseconds, the pulse amplitude is about 20 watts, the length of the area of adhesive coating irradiated by the pulse is from about 0.5 to about 2.5 mm, the laser beam is pulsed each time a length of conductor from about 0.1 to about 0.25 mm is scribed.

23. A process for scribing a conductor to the surface of a substrate wherein said conductor has an adhesive coating which is non-tacky, non-blocking and flexible and which can be activated by means of a laser beam which is delivered in substantially uniform discrete quanta of energy with the pulse repetition rate being a function of the length of conductor scribed, or the scribing speed, or a combination thereof, activating a portion of the adhesive coating and scribing the activated portion of the conductor to the surface.

24. A process according to claim 23 wherein said means for activating the adhesive coating is ultrasonic energy.

25. A process for scribing a conductor to the surface of a substrate wherein said conductor has an adhesive coating which is non-tacky, non-blocking and flexible and which can be activated by means of a pulsed laser beam which is delivered in substantially uniform discrete quanta of energy with the pulse repetition rate bein a function of the length of conductor scribed, or the scribing speed, or a combination thereof, activating a portion of the adhesive coating and scribing the activated portion of the conductor to the surface, said adhesive coating containing regions of microencapsulated adhesive material capable of being released by pressure, said process comprising the further step of applying sufficient pressure to said adhesive coating to release the adhesive material at or close to the point of contact with the substrate surface such that the adhesive material forms a bond between the conductor and the substrate.

26. A process for scribing at least one insulated conductor onto a surface of a substrate in a predetermined pattern between two points spaced apart on the surface each defining a terminal point comprising:
 providing a conductor having an adhesive coating,
  which is normally non-tacky and non-blocking prior to activation or curing,
  which can be activated by applying energy thereto, and
  which reverts to a solid non-tacky condition after activation;
 stripping the adhesive coating and insulation from the conductor at one end;
 scribing the conductor onto the surface of the substrate from said end of the conductor at a first terminal point along a predetermined path to a second terminal point;
 activating at least a portion of the adhesive coating on the conductor prior to, or simultaneously with contact with the substrate surface so that a bond is formed adhering the conductor to the surface of the substrate when said activated adhesive reverts to said solid non-tacky condition;
 cutting the conductor in the vicinity of the second terminal point; and
 stripping the adhesive coating and insulating layer in the vicinity of the cut end.

27. A process according to claim 26 wherein said insulating layer and adhesive coating is removed by a stripping means selected from the group consisting of a chemical means, a mechanical means and a radiant energy means.

28. A process according to claim 26 wherein the conductive portion of the conductor is a metallic wire, the terminal point is a plated through hole in the substrate and further including the step of inserting the exposed portion of the conductor into the plated through hole and filling the hole with solder.

29. A process according to claim 28 further including the step of inserting a component lead or other electrical contact into the hole prior to said soldering step.

30. A process according to claim 26 wherein the conductive portion of the conductor is a metallic wire, the terminal points are a plated through holes, further including the steps of inserting the exposed portion of the conductor into a first hole; scribing said conductor along a predetermined path to the vicinity of a second hole; removing the insulating layer and adhesive coating from a lenqth of the conductor; cutting the conductor and inserting it into the second hole.

31. A process according to claim 26 wherein the conductive portion of the conductor is a metallic wire and the terminal points are surface pads, further including the steps of soldering the exposed portion of the conductor to a first surface pad; scribing said conductor along a predetermined path to the vicinity of a second surface pad; removing the insulating layer and adhesive coating from a length of the conductor; cutting the conductor and soldering it to the second surface pad.

32. The process according to claim 26 wherein the adhesive coating on the conductor comprises three components:
- as a first component a film forming polymeric resin having an average molecular weight between about 10,000 and about 100,000 and having an epoxide, hydroxyl or unsaturated functinality greater than 2, said polymeric resin being selected from the group consisting of polyesters, polyurethanes, polyethers, epoxies, allyl polymers and acrylics;
- as a second component a filler, or a polyfunctional compound, or mixtures thereof, said polyfunctional compounds having an average molecular weight below 7,000 and contining a polyphenol backbone, and
- as a third component a curing agent capable of reacting or initiating a reaction with the functional groups of the polymeric resin to form crosslinks and cure the polymeric resin to a C-stage.

33. A process for scribing at least one insulated conductor onto a surface of a substrate in predetermined pattern between two points spaced apart on the surface each defining a terminal point comprising:
providing a conductor having an adhesive coating, which is normally non-tacky and non-blocking prior to activation or curing, which can be activated by applying energy thereto, and which reverts to a solid non-tacky condition after activation;
stripping the adhesive coating and insulation from the conductor at one end;
scribing the conductor onto the surface of the substrate from said end of the conductor at a first terminal point along a predetermined path to a second terminal point;
activating at least a portion of the adhesive coating on the conductor prior to, or simultaneously with contact with the substrate surface so that bond is formed adhering the conductor to the surface of the
substrate when said activated adhesive reverts to said solid non-tacky condition;
cutting the conductor in the vicinity of the second terminal point; and
stripping the adhesive coating and insulating layer in the vicinity of the cut end by a stripping means, said stripping means is a radiant energy means comprising a $CO_2$ laser beam having a spot size sufficient for evaporating the adhesive coating and the insulating layer which is scanned repeatedly along a predetermined length of conductor.

34. A process according to claim 33 wherein said stripping means is an Excimer laser beam which photodecomposes the insulating layer and adhesive coating.

* * * * *